United States Patent
Asakawa et al.

(10) Patent No.: US 9,412,943 B2
(45) Date of Patent: Aug. 9, 2016

(54) ORGANIC MOLECULAR MEMORY

(71) Applicant: Kabushiki Kaisha Toshiba, Minato-ku (JP)

(72) Inventors: Koji Asakawa, Kawasaki (JP); Yutaka Majima, Yokohama (JP); Hideyuki Nishizawa, Toshima (JP); Yusuke Tanaka, Kawasaki (JP); Shigeki Hattori, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/842,052

(22) Filed: Sep. 1, 2015

(65) Prior Publication Data

US 2016/0087202 A1 Mar. 24, 2016

(30) Foreign Application Priority Data

Sep. 19, 2014 (JP) .................................. 2014-191063

(51) Int. Cl.
*H01L 51/30* (2006.01)
*H01L 35/24* (2006.01)
*H01L 45/00* (2006.01)

(52) U.S. Cl.
CPC ........... *H01L 45/142* (2013.01); *H01L 45/1253* (2013.01)

(58) Field of Classification Search
None
See application file for complete search history.

(56) References Cited

U.S. PATENT DOCUMENTS

| 9,047,941 | B2 | 6/2015 | Nishizawa et al. | |
| 9,054,324 | B2 | 6/2015 | Nishizawa et al. | |
| 2005/0006643 | A1 | 1/2005 | Lan et al. | |
| 2006/0175604 | A1 | 8/2006 | Ufert | |
| 2008/0073618 | A1* | 3/2008 | Inagaki | B01J 31/124 252/501.1 |
| 2008/0087887 | A1* | 4/2008 | Cho | B82Y 10/00 257/40 |
| 2008/0138635 | A1* | 6/2008 | Chen | B82Y 10/00 428/447 |
| 2008/0224131 | A1* | 9/2008 | Zhang | B82Y 10/00 257/40 |
| 2012/0241713 | A1* | 9/2012 | Nishizawa | G11C 13/0016 257/4 |
| 2014/0008601 | A1* | 1/2014 | Nishizawa | H01L 51/0098 257/2 |
| 2015/0069337 | A1 | 3/2015 | Nishizawa et al. | |
| 2015/0228335 | A1 | 8/2015 | Nishizawa et al. | |
| 2015/0236171 | A1 | 8/2015 | Nishizawa et al. | |

FOREIGN PATENT DOCUMENTS

| JP | 2006-210922 | 8/2006 |
| JP | 2007-519220 | 7/2007 |
| JP | 2012-204433 | 10/2012 |
| JP | 2012-204434 | 10/2012 |
| WO | WO 2012/127863 A1 | 9/2012 |

\* cited by examiner

*Primary Examiner* — Pamela E Perkins
(74) *Attorney, Agent, or Firm* — Oblon, McClelland, Maier & Neustadt, L.L.P.

(57) ABSTRACT

An organic molecular memory in an embodiment includes a first conductive layer; a second conductive layer; and an organic molecular layer provided between the first conductive layer and the second conductive layer, the organic molecular layer including an organic molecule having an oligophenylene ethynylene backbone, the oligophenylene ethynylene backbone including three or more benzene rings, and the oligophenylene ethynylene backbone including two fluorine atoms added in ortho positions or meta positions of one of the benzene rings other than benzene rings at both ends.

18 Claims, 15 Drawing Sheets

Line symmetry

Point symmetry

Inter-Ring Mode displacement
(optical mode)

Intra-Ring Mode displacement
(optical mode)

US 9,412,943 B2

ORGANIC MOLECULAR MEMORY

CROSS-REFERENCE TO RELATED APPLICATION

This application is based upon and claims the benefit of priority from Japanese Patent Application No. 2014-191063, filed on Sep. 19, 2014, the entire contents of which are incorporated herein by reference.

FIELD

Embodiments described herein relate generally to organic molecular memories.

BACKGROUND

There is strong demand of high capacity memories for data storage. To obtain high capacity, each memory shrinks in size and the conventional semi-conductor memory devices are facing their limitation. If organic molecules were used in memory cells instead of that, the memory cells would be made smaller in size, because the devices could be constructed by organic molecules, which are as small as single nanometers in size. As a result, storage density of memory using molecules can be increased. One of the ideas is resistance change memory, that the molecules can change its electric resistance between the low resistance state and the high resistance state by applied electric current. For this purpose, molecules having a function to change its resistance depending on the applied electric field or injected charges are introduced between upper and lower electrodes. A memory cell is realized using such molecules, the voltage is applied between the upper and lower electrodes to change the state and the difference of state can be detected by the electric current. In order to improve the reliability of organic molecular memories manufactured under a small design rule, and in order to achieve a reduction in power consumption, a memory cell is required to operate at a low voltage. Thus, it is desired that a resistance change of a memory cell is realized at a low voltage. However, smaller the memory cell, shorter the distances between the charges in the molecules and the surrounding electrodes. Therefore, the charges are easily escaped or leaked from the molecules due to electron movement between the molecules and the electrodes. As a result, the charge retention time (the data retention time or life) of the organic molecular memory becomes shorter.

DETAILED DESCRIPTION

Figure 1:
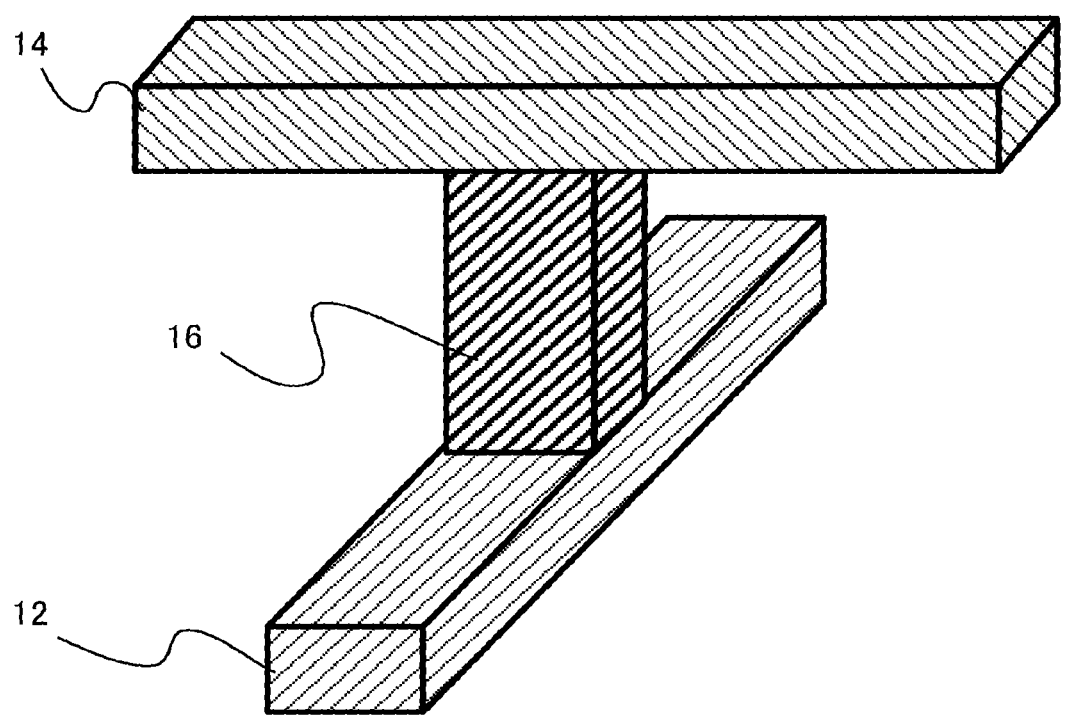
FIG. 1 is a schematic perspective view of an organic molecular memory in a first embodiment.

An organic molecular memory in an embodiment includes a first conductive layer; a second conductive layer; and an organic molecular layer provided between the first conductive layer and the second conductive layer, the organic molecular layer including an organic molecule having an oligophenylene ethynylene backbone, the oligophenylene ethynylene backbone including three or more benzene rings, and the oligophenylene ethynylene backbone including two fluorine atoms added in ortho positions or meta positions of one of the benzene rings other than benzene rings at both ends.

In the description, the same or similar members are denoted by the same reference numerals, and redundant descriptions of them will not be made.

In the description, the words "upper" and "lower" are used to express a relative positional relationship between components or the like. In the description, the concept of the words "upper" and "lower" does not necessarily refer to a relationship with respect to the direction of gravity.

In the description, the word "resistance-change type molecular chain" means a molecular chain having the capability of being changed in resistance by the presence or absence of an electric field or the injection of charges.

In the description, the word "chemical bond" is a concept referring to one of a covalent bond, an ionic bond, and a metallic bond, and is a concept excluding a hydrogen bond and a bond by a Van der Waals force. Oligo-phenylene-ethynylene (OPE) molecular chains have been studied for the two-terminal resistance change memory. These kinds of molecules are generally shows good conductivity since they consist of pi-conjugation in their main chain and can be used as a molecular wire. Some OPE molecules were reported that they showed resistance change and memory effect. For example, if a pair of electron-withdrawing group like a nitro group and electron-releasing group like an amino group were attached at the middle benzene of the OPE molecular chain, these molecules were reported good resistance change. Especially, 4-[2-nitro-5-amino-4-(phenylethynyl)phenylethynyl]benzenethiol shows negative differential conductivity (NDC). NDC is the phenomenon that as the voltage applies to the both ends of the molecule increases, the current increases but the conductivity plunges at a certain voltage. The difference of the current in these two states may be used as a memory and this phenomenon is quite useful for designing the memory cells. However, there are not so many options of molecular structure, which shows large resistance change and NDC. In addition, these kinds of molecules are very difficult to synthesize. The inventors were theoretically and experimentally looking for the molecules showing greater resistance change and NDC, and easy to synthesize.

Hereinafter, embodiments will be described with reference to the drawings.

First Embodiment

An organic molecular memory in this embodiment includes a first conductive layer, a second conductive layer, and an organic molecular layer provided between the first conductive layer and the second conductive layer and containing an organic molecule that has an oligophenylene ethynylene backbone including three or more benzene rings and having two fluorine atoms added in ortho positions of a benzene ring other than benzene rings at both ends.

The organic molecule in this embodiment is chemically bonded to the first conductive layer or the second conductive layer.

The organic molecule in this embodiment is described by Molecular Formula (1):

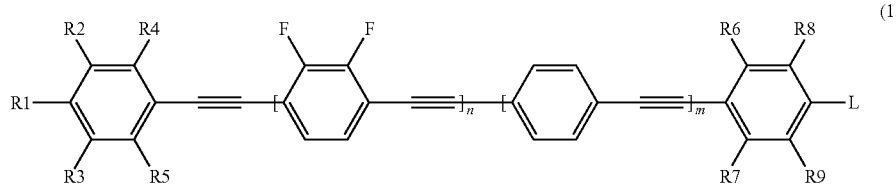

R1 in Molecular Formula (1) is a chemically modifying group selected from the group consisting of an amino group (—NH$_2$), a hydroxy group (—OH), and a nitro group (—NO$_2$), or a hydrogen atom, or a fluorine atom, R2 to R9 are hydrogen atoms or fluorine atoms, L is a chemically modifying group chemically bonding the organic molecule to the first conductive layer or the second conductive layer, n is one or two, and m is zero, one, or two.

According to this embodiment, the above structure produces a resistance change in the organic molecule at a low voltage. Therefore, an organic molecular memory that operates at a low voltage can be realized.

Figure 2:
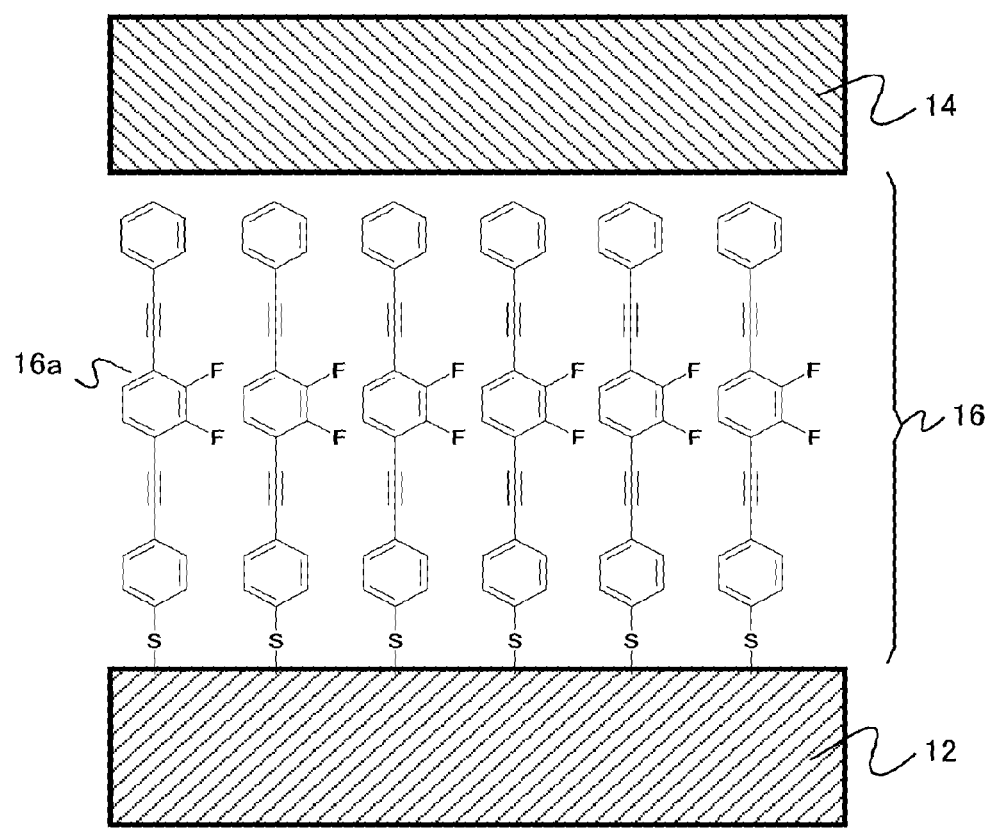
FIG. 2 is a schematic cross-sectional view of a memory cell portion of the organic molecular memory in the first embodiment.

FIG. 1 is a schematic perspective view of an organic molecular memory in this embodiment. FIG. 2 is a schematic cross-sectional view of a memory cell portion of the organic molecular memory in the first embodiment.

The organic molecular memory in this embodiment is a resistance-change type organic molecular memory of a cross-point type. As shown in FIGS. 1 and 2, a lower electrode wire (first conductive layer) 12 provided on a top portion of a substrate (not shown), for example, is provided. An upper electrode wire (second conductive layer) 14 is provided to cross the lower electrode wire 12. A design rule of electrode wiring is, for example, 5 nm or more to 20 nm or less.

As shown in FIGS. 1 and 2, an organic molecular layer 16 is provided between the lower electrode wire 12 and the upper electrode wire 14 at an intersection of the lower electrode wire 12 and the upper electrode wire 14. A plurality of resistance-change type molecular chains 16a constitutes the organic molecular layer 16. The thickness of the organic molecular layer 16 is, for example, 1 nm or more to 10 nm or less. In terms of scaling-down of a memory cell, it is desirably 1 nm or more to 5 nm or less. A layer for ensuring rectification or the like may be interposed at the top or the bottom of an organic molecular layer, but is not included in the thickness.

The organic molecular layer 16 is provided at each of the intersections of the lower electrode wires 12 and the upper electrode wires 14 as shown in FIG. 1, for example, to form memory cells. Thus, a memory cell array including a plurality of memory cells is realized.

First, as shown in FIG. 2, the organic molecular layer 16 in this embodiment includes the plurality of resistance-change type molecular chains 16a. The resistance-change type molecular chains 16a are an example of an organic molecule described by Molecular Formula (1) in this embodiment.

One ends of the resistance-change type molecular chains 16a are chemically bonded to the lower electrode wire 12. The resistance-change type molecular chains 16a extend from the lower electrode wire 12 toward the upper electrode wire 14.

The lower electrode wire 12 is formed on a silicon (Si) substrate (not shown), for example. The lower electrode wire 12 is tungsten (W) as a metallic material, for example. The upper electrode wire 14 is molybdenum (Mo) as a metallic material, for example.

Figure 3A:
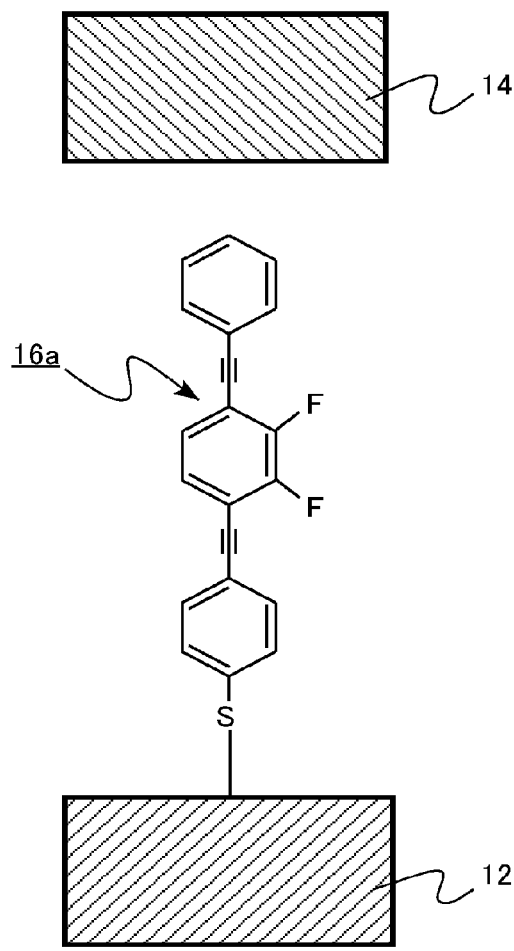
FIGS. 3A and 3B are diagrams illustrating an example of a molecular structure of an organic molecule in the memory cell portion in the first embodiment.
Figure 3B:
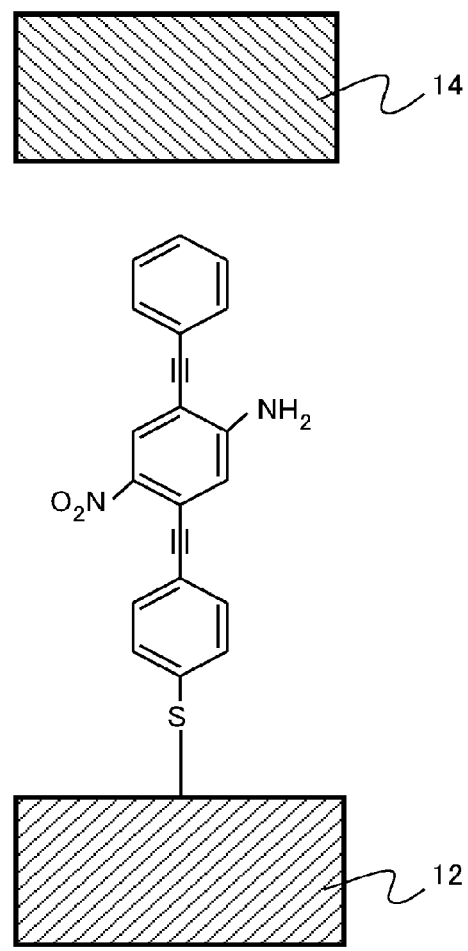

FIGS. 3A and 3B are diagrams illustrating an example of a molecular structure of an organic molecule in a memory cell portion in this embodiment. FIG. 3A shows an organic molecule in this embodiment, and FIG. 3B shows an organic molecule in a comparative embodiment.

Figure 4:
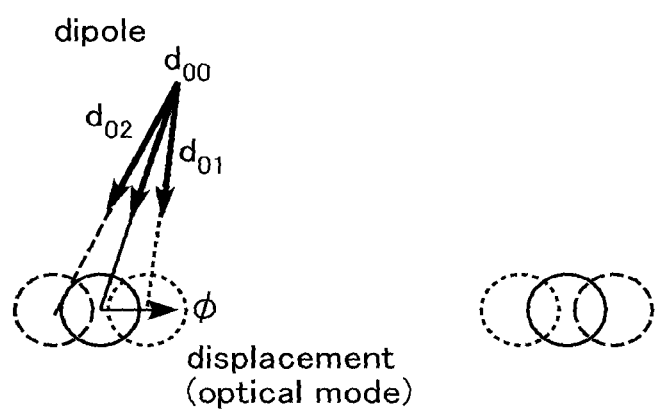
FIG. 4 is a diagram illustrating a principle of development of the resistance change characteristics of an organic molecule in the first embodiment.

The resistance-change type molecular chains 16a constituting the organic molecular layer 16 in this embodiment have a molecular structure as shown in FIG. 3A, for example. The resistance-change type molecular chain 16a in FIG. 3A is a derivative of a resistance-change type molecular chain in the comparative embodiment as shown in FIG. 3B, 4-[2-nitro-5-amino-4-(phenylethynyl)phenylethynyl]benzenethiol.

In the resistance-change type molecular chain 16a in FIG. 3A, R1 to R9 are hydrogen atoms, n is one, m is zero, and L is a thiol group in Molecular Formula (1).

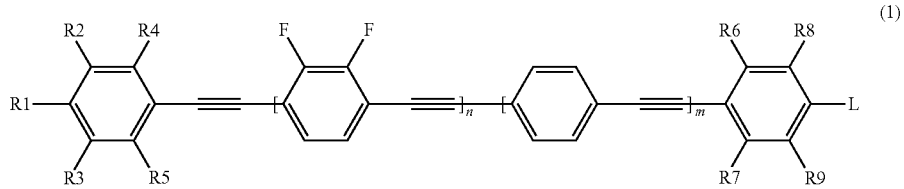

The resistance-change type molecular chains in FIGS. 3A and 3B have a thiol group as a linker at one end. A sulfur atom (S) is chemically bonded to a surface of the lower electrode wire 12. Here, a linker means a chemically modifying group having a function of fixing a molecule to an electrode (conductive layer) by chemical bonding.

The surface of the lower electrode wire 12 and the thiol group are bonded to form the organic molecular layer 16 as a so-called self-assembled monolayer (SAM). On the other hand, a benzene ring at the other end of the resistance-change type molecular chain 16a is not chemically bonded to a surface of the upper electrode wire 14.

Further, the resistance-change type molecular chains in FIGS. 3A and 3B have an oligophenylene ethynylene backbone including three benzene rings. The resistance-change type molecular chain 16a in FIG. 3A has two fluorine atoms (F) added in ortho positions of the middle benzene ring.

The oligophenylene ethynylene backbone exhibits good conductivity because it includes $\pi$ bonds. Therefore, the organic molecules in FIGS. 3A and 3B both exhibit good conductivity.

Further, the organic molecule in FIG. 3A has two fluorine atoms (F) added in ortho positions of the middle benzene ring, and thus has the capability of being changed in resistance by the presence or absence of an electric field or the injection of charges. The organic molecule in FIG. 3B has a nitro group and an amino group added to the middle benzene ring, and thus has the capability of being changed in resistance by the presence or absence of an electric field or the injection of charges.

The organic molecules in FIGS. 3A and 3B exhibit negative differential conductance (NDC). NDC is a phenomenon in which current increases as applied voltage is increased, but the current suddenly decreases at a predetermined voltage.

The organic molecules in FIGS. 3A and 3B are resistance-change type molecular chains. The organic molecules shown in FIGS. 3A and 3B can be switched between a low-resistance state and a high-resistance state by applying a voltage across both ends. By using a change in the resistance state, a memory cell can be realized.

In this embodiment, as fluorine atoms are introduced into the middle benzene ring of phenylene ethynylene molecular chains. The two fluorine atoms greatly change molecular orbitals. As a result, the highest occupied molecular orbital (HOMO) and the lowest unoccupied molecular orbital (LUMO) are changed in shape.

A phonon vibration of a carbon atom in the benzene ring to which the two fluorine atoms are added interacts with an electron passing through the molecule. The vibration of the carbon atoms of the benzene ring that the fluorine atom(s) are attached can couple the electrons which are passing through the molecules. The phenomenon is explained as electron-phonon coupling. The stronger the electron phonon-coupling, the resistance change is greater as we explained later. Therefore, charges in the organic molecular layer are hardly pulled out of the organic molecular layer, and the charge retention properties of the organic molecular memory (hereinafter also referred to simply as the molecular memory) are improved.

Strong coupling between an electron and a phonon changes the state of the molecule, resulting in the occurrence of a misalignment between the HOMO level and the Fermi level. The misalignment between the HOMO level and the Fermi level is considered to be the cause of NDC development in this embodiment.

The organic molecule in this embodiment shown in FIG. 3A has an oligophenylene ethynylene backbone including three benzene rings and two fluorine atoms (F) added in ortho positions at side chains of the middle benzene ring. This structure can make the HOMO energy level shallower than the organic molecule in the comparative embodiment shown in FIG. 3B, which has been confirmed by calculation using density functional method B3LYP1. A reduction in the HOMO energy level is directly linked to a reduction in operating voltage.

Thus, according to this embodiment, an organic molecular memory that operates at a low voltage can be realized.

The organic molecule in the comparative embodiment is an asymmetric organic molecule with a pair of an electron withdrawing group and an electron donating group added to a single benzene ring. Such an asymmetric organic molecule is difficult to synthesize. The organic molecule in this embodiment has a higher symmetry than the organic molecule in the comparative embodiment, and is easy to synthesize.

In this embodiment, too long length of the organic molecule can cause too great resistance of the organic molecule, making a memory operation difficult. Too small a HOMO-LUNO gap can make a switching operation difficult. For the length of m, a switching voltage due to NDC shifts to a lower voltage, but a difference of m does not greatly change the essence of NDC in current-voltage characteristics. Therefore, as shown in Molecular Formula (1), it is desirable to set the maximum value of n at 2 and the maximum value of m at 3.

In terms of easy synthesis of the organic molecule and facilitating the development of the NDC characteristics, a benzene ring having two fluorine atoms in ortho positions is desirably located in a position adjacent to a benzene ring at an end opposite to a linker as shown in Molecular Formula (1).

In this embodiment, R1 to R9 in Molecular Formula (1) are desirably hydrogen atoms in terms of facilitating the synthesis of the organic molecule.

It is desirable that n is 1 and m is 0 in Molecular Formula (1) in terms of facilitating the synthesis of the organic molecule, and in terms of scaling-down the memory cell.

At least one of R2 to R9 in Molecular Formula (1) is desirably a fluorine atom. By one of the benzene rings at the both ends having an electron withdrawing group such as a fluorine atom, a movable and great electric dipole efficiency is provided. Thus, the relative permittivity of the organic molecular layer 16 is increased. As a result, the charge retention characteristics of the organic molecular memory are improved. Further, a voltage applied from one end of the molecule is increased. As a result, rectification is developed. In this case, when fluorine atoms are added to R2 to R5, R6 to R9 preferably have no fluorine atoms. When fluorine atoms are added to R6 to R9, R2 to R5 preferably have no fluorine atoms.

L in Molecular Formula (1) is desirably a chemically modifying group selected from the group consisting of a thiol group, a silanol group such as monomethoxysilane, trimethoxysilane, monoethoxysilane, or triethoxysilane, and a phosphonate group.

R1 in Molecular Formula (1) is desirably an amino group (—$NH_2$), a hydroxy group (—OH), or a nitro group (—$NO_2$) in terms of developing rectification in the organic molecule. In particular, a nitro group-modified one has an increased dipole, developing rectification. Therefore, resistance-change type molecular chains can also have a diode function required for each memory cell to realize a cross-point type memory cell. Thus, further scaling-down of a memory cell can be achieved.

Hereinafter, principles of development of the resistance change characteristics of the organic molecule in this embodiment and the results of calculation of the characteristics will be described. FIGS. 4 to 8 are diagrams illustrating the principles of development of the resistance change characteristics of the organic molecule in this embodiment.

When a charge is injected from an electrode into a memory molecule, the Coulomb force of the charge produces polarization of the memory molecule, a surrounding molecule, and the electrode. When time to produce polarization is sufficiently shorter than time for which the charge (carrier) is present in the molecule ($\tau_R$: time since injection into the molecule until passing out therethrough), polarization occurs before the charge passes out through the molecule. Thus, the Coulomb force between the charge and the polarization acts on the charge. The polarization occurs in a direction to cancel out the charge, and thus always becomes an attractive force.

Therefore, for the charge to pass outside, a force of binding it onto the molecule acts on it by energy produced by the Coulomb attractive force. That is, the charge is bound by polarization produced by itself. This state is called self-trapping. When polarization is great, binding energy is great, causing the charge to be bound onto the molecule. This is called a polaron.

A polaron can hop with the aid of thermal energy, and a polaron hopping rate R (piece/second) at this time is expressed by the following mathematical expression:

$$R = v \exp\left(-\frac{(\Delta - 2W)^2}{4WkT}\right)$$

wherein, $\Delta$ is difference between the level of the polaron and an outside (the charge moves out to) level, W is binding energy, $v$ is escape frequency (/second), k is Boltzmann's constant, and T is temperature.

When a molecule is interposed between two electrodes, a charge injected into the molecule from one of the electrodes comes into a polaron state in which it is bound onto the molecule to be immovable when the polarization of the molecule is great. A rate at which the charge on the molecule passes out to the opposite electrode is given by the above expression. This rate is sufficiently smaller than the rate at which the charge is injected from the electrode, so that current I flowing across the electrodes is determined in rate by the polaron hopping rate, and current is proportional to the rate.

A polaron is at the molecule level ($E_M$), and passes out to the Fermi level ($E_F$) of the opposite electrode, and thus $\Delta$ is expressed by the following mathematical expression:

$$\Delta = E_F - E_M$$

When a voltage is applied across the electrodes, the Fermi level is shifted by the voltage. At this time, the rate at which a charge passes out through a molecule to an electrode increases with an increase in voltage, and becomes the maximum at the voltage at which $E_F = E_M + 2W$, and becomes small at a voltage higher than this. Thus current increases with an increase in voltage, and then turns into decrease.

This phenomenon is called negative differential conductance (NDC), and is important characteristics for a resistance-change type memory.

For NDC to occur, great polarization energy, that is, a high polarization rate is necessary as described above. Polarization is broadly classified into electron polarization due to a change in position of an electron and lattice polarization in which a lattice changes (a coupling length changes) or the position and magnitude of a dipole changes. Of them, electron polarization is virtually determined by the number of electrons on a molecule (in particular, the number of $\pi$ electrons). Thus it is lattice polarization that can be designed with a molecular structure. Lattice polarization is brought by a change in position or direction of a dipole induced in a structure by a displacement between an atomic nucleus and an electron (longitudinal charge) and a displacement from a stable position in the lattice, which are induced by lattice vibrations and their superposition.

A change of a dipole due to the displacement in direction is described as a change in polarization due to a phonon. The polarization and a charge are bound by a Coulomb force. When the polarization is great, the polarization is attracted around the charge, forming a state where the charge and the polarization move together. This state is referred to as a polaron. Therefore, when a change occurs in polarization effect, depending on the position of a dipole, the conduction characteristics of the molecule change. Thus, it will be described below how polarization produced by a phonon changes, depending on the position of a dipole.

FIG. 4 illustrates an effect of a bond moment on electron-phonon coupling. In FIG. 4, an X direction is a horizontal direction, which is conformed to the flat sheet surface on which a $\pi$ conjugate sits, and a Y direction is a vertical direction. Suppose that an atom at position (0, 0) is displaced by a phonon by $\phi$ in the X direction. This changes vector $d_{00}$ of a dipole present at side chain position (a, b) to $d_{01}$ expressed by the following mathematical expression:

$$d_{00} = \frac{|d|}{\sqrt{a^2 + b^2}}(a, b)$$

$$d_{01} = \frac{|d|}{\sqrt{(a+\phi)^2 + b^2}}(a + \phi, b)$$

When displacement $\phi$ due to the phonon is sufficiently smaller than a, b, it can be approximated by the following mathematical expression:

$$\frac{1}{\sqrt{(a+\phi)^2 + b^2}} = \frac{1}{\sqrt{a^2 + b^2}\sqrt{\frac{a^2 + b^2 + 2a\phi + \phi^2}{a^2 + b^2}}}$$

$$\simeq \frac{1}{\sqrt{a^2 + b^2}} \frac{1}{\sqrt{1 + \frac{2a\phi}{a^2 + b^2}}}$$

$$\simeq \frac{1}{\sqrt{a^2 + b^2}}\left(1 - \frac{a\phi}{a^2 + b^2}\right)$$

Therefore, polarization (dipole) P induced in a main chain direction is expressed by the following mathematical expression:

$$P = d_{01} - d_{00}$$

$$= \frac{|d|}{\sqrt{a^2 + b^2}}\left(a - \frac{a^2\phi}{a^2 + b^2}, b - \frac{ab\phi}{a^2 + b^2}\right) - \frac{|d|}{\sqrt{a^2 + b^2}}(a, b)$$

$$= -\frac{|d|}{\sqrt{a^2 + b^2}}\left(\frac{a^2}{a^2 + b^2}, \frac{ab}{a^2 + b^2}\right)\phi$$

The above mathematical expression shows that introduction of a dipole into a side chain can increase polarization.

In an actual molecular structure, a plurality of dipoles is introduced by a plurality of substituents in many cases. Here, it is evaluated what polarization dipoles introduced into adjacent atoms generate due to optical phonons.

Figure 5A:
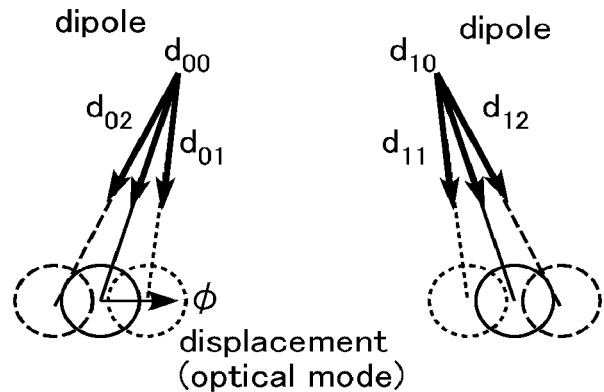
FIGS. 5A and 5B are diagrams illustrating a principle of development of the resistance change characteristics of an organic molecule in the first embodiment.
Figure 5B:
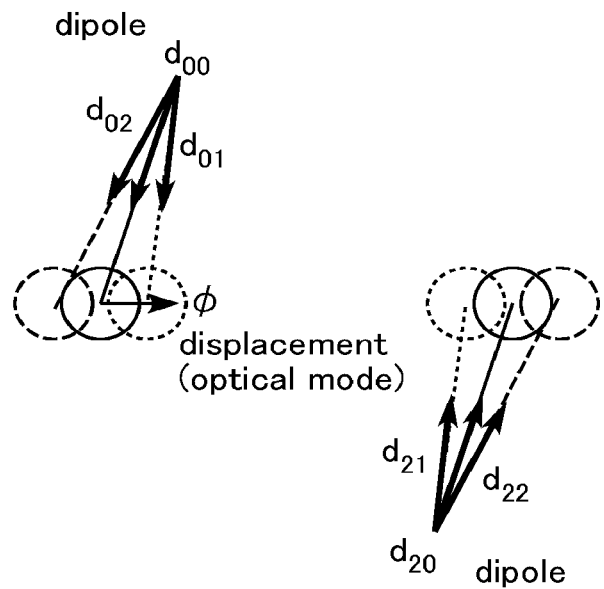

FIGS. 5A and 5B illustrate an effect of a bond moment on electron-phonon coupling, with respect to a line-symmetric arrangement and a point-symmetric arrangement. An X direction is a horizontal direction, which is conformed to a flat sheet surface on which a π conjugate sits, and a Y direction is a vertical direction.

In a π-conjugated system, optical phonons move in opposite directions between adjacent atoms. Thus, displacements of dipoles at side chains of the adjacent atoms are in opposite main chain directions (X directions). This state is shown in FIGS. 5A and 5B. When side chains having dipoles are introduced into the adjacent atoms, two cases, line-symmetric introduction as in FIG. 5A and point-symmetric introduction as in FIG. 5B are conceived.

In the case of line symmetry, polarization is expressed by the following mathematical expression:

$$P_1 = -\frac{|d|}{\sqrt{a^2+b^2}}\left(\frac{a^2}{a^2+b^2}, \frac{ab}{a^2+b^2}\right)\phi$$

wherein $P_1$ is polarization of a dipole (a, b) due to a phonon.

Polarization $P_2$ of the other dipole (−a, b) is expressed by the following mathematical expression based on the symmetry of phonons (displacement is −φ):

$$P_2 = \frac{|d|}{\sqrt{a^2+b^2}}\left(\frac{a^2}{a^2+b^2}, -\frac{ab}{a^2+b^2}\right)\phi$$

Therefore, the entire polarization P is expressed by the following mathematical expression:

$$P = P_1 + P_2 = \frac{|d|}{\sqrt{a^2+b^2}}\left(0, \frac{2ab}{a^2+b^2}\right)\phi$$

As is clear from the above expression, it is found that in the case of a line-symmetric arrangement, polarization in the main chain directions cancels each other out, and polarization in the vertical direction remains.

Next, in the case of point symmetry, polarization is expressed by the following mathematical expression:

$$P_1 = -\frac{|d|}{\sqrt{a^2+b^2}}\left(\frac{a^2}{a^2+b^2}, \frac{ab}{a^2+b^2}\right)\phi$$

wherein $P_1$ is polarization of a dipole (a, b) due to a phonon.

Polarization $P_2$ of the other dipole (−a, −b) is expressed by the following mathematical expression based on the symmetry of phonons (displacement is −φ):

$$P_2 = \frac{|d|}{\sqrt{a^2+b^2}}\left(\frac{a^2}{a^2+b^2}, \frac{ab}{a^2+b^2}\right)\phi$$

Therefore, the entire polarization P is expressed by the following mathematical expression, which shows that the polarization cancels each other out completely. That is, contributions of dipoles introduced in a point symmetry cancel each other out, and do not contribute to polarization.

$$P=P_1+P_2=0$$

Figure 6A:
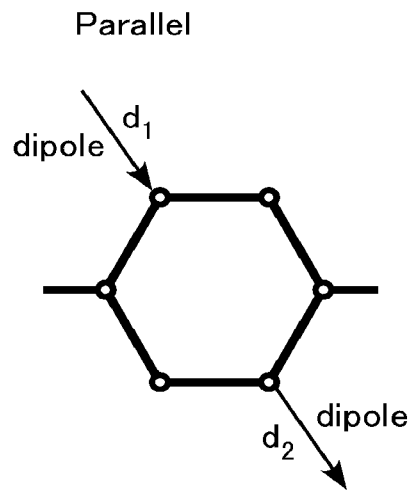
FIGS. 6A and 6B are diagrams illustrating a principle of development of the resistance change characteristics of an organic molecule in the first embodiment.
Figure 6B:
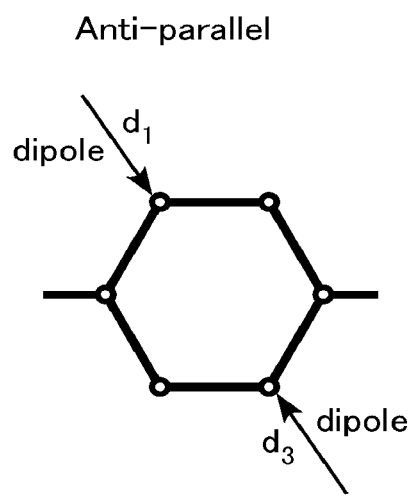

In a π-conjugated system having electrical conduction, a ring-shaped structure is as important as the above-described linear structures. FIGS. 6A and 6B show the direction of dipoles produced by a ring-shaped structure and substituents. An X direction is a horizontal direction, which is conformed to the flat sheet surface on which a π conjugate sits, and a Y direction is a vertical direction.

The following considers a ring structure (phenyl ring) as in FIGS. 6A and 6B, and considers polarization of dipoles bonded to this due to phonons. In this case, dipoles bonded to adjacent atoms are the same as in the case of straight chains, and thus only dipoles in opposite positions (para positions) in the ring unique to a ring structure need to be considered. In this case, there are a case where the directions of dipoles are parallel as in FIG. 6A and a case where they are antiparallel as in FIG. 6B.

Figure 7A:
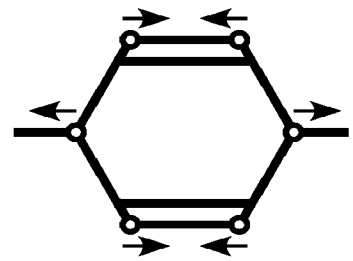
FIGS. 7A and 7B are diagrams illustrating a principle of development of the resistance change characteristics of an organic molecule in the first embodiment.
Figure 7B:
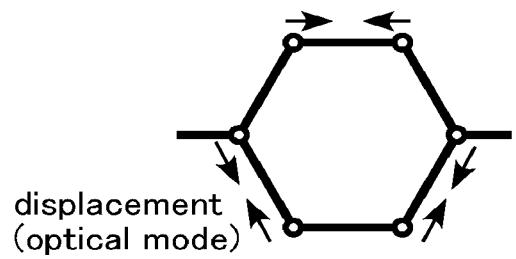

FIGS. 7A and 7B illustrate a ring-shaped structure and the mode of optical phonons. An X direction is a horizontal direction, which is conformed to the flat sheet surface on which a π conjugate sits, and a Y direction is a vertical direction.

In a ring-shaped structure, there are two types of modes, a mode in which optical phonons head toward the outside of the ring shown in FIG. 7A (quinone mode) and an intra-ring mode shown in FIG. 7B (phenyl mode). It has been known that in ring-shaped pi-conjugated systems connected in para positions, π electrons are localized inside each ring in a neutral state, while in a charged state (polaron), π electrons are delocalized across the rings, and thus the structure becomes like quinone.

In the quinone mode, the vibration directions of atoms at the roots of two dipoles are opposite directions (vibration vectors are (φ, 0) and (−φ, 0). In the phenyl mode, the vibration directions of atoms at the roots of two dipoles are not opposite directions. In this case, when the vibration of an upper atom in FIG. 7B is in a (φ, 0) direction, the vibration of a lower atom is in a (φ2, $3^{1/2}$φ/2) direction. When the vibration of an upper atom is in a (−φ2, −$3^{1/2}$φ/2) direction, the vibration of a lower atom is in a (−φ, 0) direction.

Therefore, although vibration directions are complicated in the phenyl mode, by inverting the sign of φ and interchanging atoms, they become one, which shows that it is only required to perform calculation for a single case as is conventionally done. In the following, calculation is performed on four combinations of them (=two types of dipole×two types of phonon).

A case where dipoles are parallel and phonons are in quinone mode is considered. In this case, polarization is expressed by the following mathematical expression:

$$P_1 = -\frac{|d|}{\sqrt{a^2+b^2}}\left(\frac{a^2}{a^2+b^2}, \frac{ab}{a^2+b^2}\right)\phi$$

wherein $P_1$ is polarization of a dipole (a, b) due to a phonon.

Polarization $P_2$ of the other dipole (a, b) is expressed by the following mathematical expression based on the symmetry of phonons (displacement is −φ):

$$P_2 = \frac{|d|}{\sqrt{a^2+b^2}} \left( \frac{a^2}{a^2+b^2}, \frac{ab}{a^2+b^2} \right) \phi$$

Therefore, the entire polarization P is expressed by the following mathematical expression, which shows that the polarization cancels each other out completely. That is, the contributions of dipoles introduced in a point symmetry cancel each other out, and do not contribute to polarization.

$$P = P_1 + P_2 = 0$$

Next, a case where dipoles are parallel and phonons are in the phenyl mode is considered. In this case, polarization is expressed by the following mathematical expression:

$$P_1 = -\frac{|d|}{\sqrt{a^2+b^2}} \left( \frac{a^2}{a^2+b^2}, \frac{ab}{a^2+b^2} \right) \phi$$

wherein $P_1$ is polarization of a dipole (a, b) due to a phonon.

Based on the symmetry of phonons (displacement is ($\phi 2$, $3^{1/2}\phi/2$)), polarization $P_2$ of the other dipole (a, b) is expressed by the following mathematical expression:

$$P_2 = -\frac{|d|}{2\sqrt{a^2+b^2}} \left( \frac{a^2+\sqrt{3}\,ab}{a^2+b^2}, \frac{ab+\sqrt{3}\,b^2}{a^2+b^2} \right) \phi$$

Therefore, the entire polarization P is expressed by the following mathematical expression, and the dipole effects are summed to be greater. That is, this arrangement can increase polarization due to phonons in the phenyl mode.

$$P = P_1 + P_2 = -\frac{|d|}{2\sqrt{a^2+b^2}} \left( \frac{3a^2+\sqrt{3}\,ab}{a^2+b^2}, \frac{ab+(\sqrt{3}+2)b^2}{a^2+b^2} \right) \phi$$

Next, a case where dipoles are antiparallel and phonons are in the quinone mode is considered. In this case, polarization is expressed by the following mathematical expression:

$$P_1 = -\frac{|d|}{\sqrt{a^2+b^2}} \left( \frac{a^2}{a^2+b^2}, \frac{ab}{a^2+b^2} \right) \phi$$

wherein $P_1$ is polarization of a dipole (a, b) due to a phonon.

Polarization $P_2$ of the other dipole (−a, −b) is expressed by the following mathematical expression based on the symmetry of phonons (displacement is −$\phi$):

$$P_2 = -\frac{|d|}{\sqrt{a^2+b^2}} \left( \frac{a^2}{a^2+b^2}, \frac{ab}{a^2+b^2} \right) \phi$$

Therefore, the entire polarization P is expressed by the following mathematical expression, and the dipole effects are summed to be greater. That is, this arrangement can increase polarization due to phonons in the quinone mode.

$$P = P_1 + P_2 = -2\frac{|d|}{2\sqrt{a^2+b^2}} \left( \frac{a^2}{a^2+b^2}, \frac{ab}{a^2+b^2} \right) \phi$$

Finally, a case where dipoles are antiparallel and phonons are in the phenyl mode is considered. In this case, polarization is expressed by the following mathematical expression:

$$P_1 = -\frac{|d|}{\sqrt{a^2+b^2}} \left( \frac{a^2}{a^2+b^2}, \frac{ab}{a^2+b^2} \right) \phi$$

wherein $P_1$ is polarization of a dipole (a, b) due to a phonon.

Polarization $P_2$ of the other dipole (−a, −b) is expressed by the following mathematical expression based on the symmetry of phonons (displacement is ($\phi 2$, $3^{1/2}\phi/2$)):

$$P_2 = \frac{|d|}{2\sqrt{a^2+b^2}} \left( \frac{a^2+\sqrt{3}\,ab}{a^2+b^2}, \frac{ab+\sqrt{3}\,b^2}{a^2+b^2} \right) \phi$$

Therefore, the entire polarization P is expressed by the following mathematical expression:

$$P = P_1 + P_2 = -\frac{|d|}{2\sqrt{a^2+b^2}} \left( \frac{-a^2+\sqrt{3}\,ab}{a^2+b^2}, \frac{-ab+\sqrt{3}\,b^2}{a^2+b^2} \right) \phi$$

As is clear from the above expression, it is found that polarization cancels each other out, and only small polarization remains. That is, its contribution to electron-phonon coupling is small. Therefore, dipoles introduced in this manner are less likely to change the conduction characteristics of the original main chain.

Figure 8:
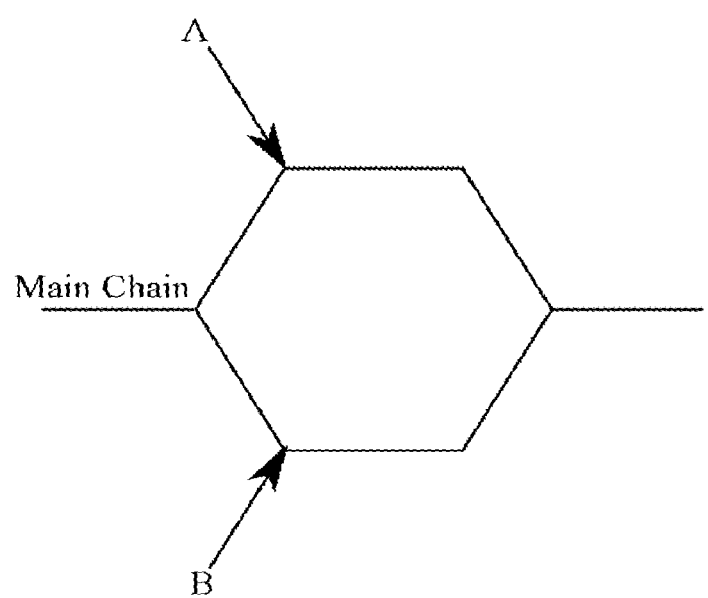
FIG. 8 is a diagram illustrating a principle of development of the resistance change characteristics of an organic molecule in the first embodiment.

Other than the above, there are dipoles in positions not adjacent to each other in a ring-shaped structure (ring-shaped meta positions). FIG. 8 illustrates dipoles located in ring-shaped meta positions.

When calculated on the case of the ring-shaped meta positions, the entire polarization P is expressed by the following mathematical expression, in which components in an X direction remain for dipoles in the same direction, and components in the opposite directions cancel out:

$$P = \frac{|d|}{\sqrt{a^2+b^2}} \left( \frac{2b^2}{a^2+b^2}, 0 \right) \phi$$

A summary of the relationships between the positions and directions of dipoles and polarization is as in Table 1.

TABLE 1

| Structure | | Phonon Type | | |
|---|---|---|---|---|
| Dipole Position | Dipole Direction | Optical Mode | Intra-Ring | Inter-Ring |
| Adjacent Atoms | Same Directions (Line Symmetry) | Polarization Present | Polarization Present | Polarization Present |

TABLE 1-continued

| Structure | | | | |
|---|---|---|---|---|
| Dipole Position | Dipole Direction | Phonon Type | | |
| | | Optical Mode | Intra-Ring | Inter-Ring |
| | Opposite Directions (Point Symmetry) | Polarization Absent | Polarization Absent | Polarization Absent |
| Ring-Shaped Para Positions | Parallel | — | Reinforce Mutually | Polarization Absent |
| | Antiparallel | — | Polarization Present | Reinforce Mutually |
| Ring-Shaped Meta Positions | Same Directions | — | Polarization Present | Polarization Present |
| | Opposite Directions | — | Polarization Absent | Polarization Absent |

By disposing dipoles produced by substituents in positions of a main chain and a ring of a one-dimensional n conjugated molecule, based on Table 1, polarization can be controlled. Thus, development of NDC in current-voltage characteristics can be controlled.

Introduction of dipoles in main chain directions can develop rectification. By introducing dipoles in the same direction in meta positions of the ring in Table 1, dipoles in the main chain direction can be provided, and at the same time polarization can be increased.

It can be determined what vibration contributes, using a molecular orbital method. A specific vibration mode can be seen by performing structure optimization and vibration analytical calculation using base function 6-31G(d), using density functional method B3LYP1. In this case, by multiplying a calculated wave number (unit: $cm^{-1}$) by a scale factor of 0.8929, a wave number that can correspond to a measured value can be obtained.

According to this calculation, in the case of an organic molecule having the following molecular structure illustrated in FIG. 3A, a vibration mode in the entire main chain of the molecule is in the vicinity of 929 $cm^{-1}$ and 1118 $cm^{-1}$, which displaces the C—F bonds, and displacement of the C—F bonds due to the intra-ring mode can be observed at 1224 $cm^{-1}$ and displacement of the C—F bonds due to the inter-ring mode at 1498 $cm^{-1}$. Thus, the organic molecule develops NDC.

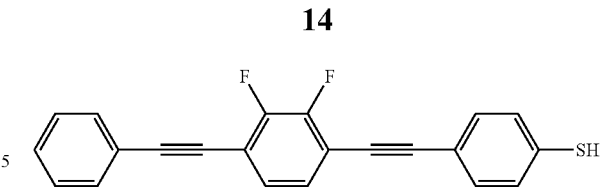

Further, as the results of calculation, while the HOMO level is −5.79 eV in the comparative embodiment in FIG. 3B, it is −5.63 eV in the case of an organic molecule with the above molecular structure (the same as the resistance-change type molecular chain 16a in FIG. 3A), which is shallower. Thus, the operating voltage can be reduced more than the comparative embodiment.

As above, this embodiment can realize an organic molecular memory that operates at a low voltage.

Second Embodiment

An organic molecular memory in this embodiment is the same as the first embodiment except that two fluorine atoms are added in meta positions of a benzene ring other than benzene rings at both ends of an organic molecule having an oligophenylene ethynylene backbone. Therefore, contents overlapping with those in the first embodiment will not be described.

An organic molecule in this embodiment is described by Molecular Formula (2):

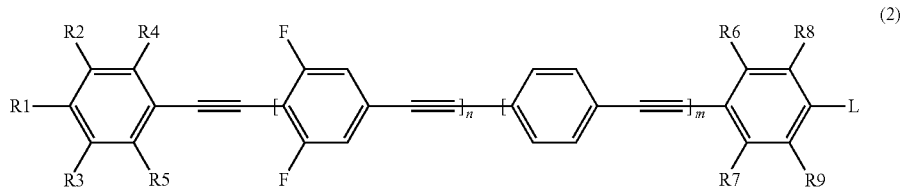

R1 in Molecular Formula (2) is a chemically modifying group selected from the group consisting of an amino group (—NH$_2$), a hydroxy group (—OH), and a nitro group (—NO$_2$), or a hydrogen atom, or a fluorine atom, R2 to R9 are hydrogen atoms or fluorine atoms, L is a chemically modifying group chemically bonding the organic molecule to a first conductive layer or a second conductive layer, n is one or two, and m is zero, one, or two.

Figure 9:
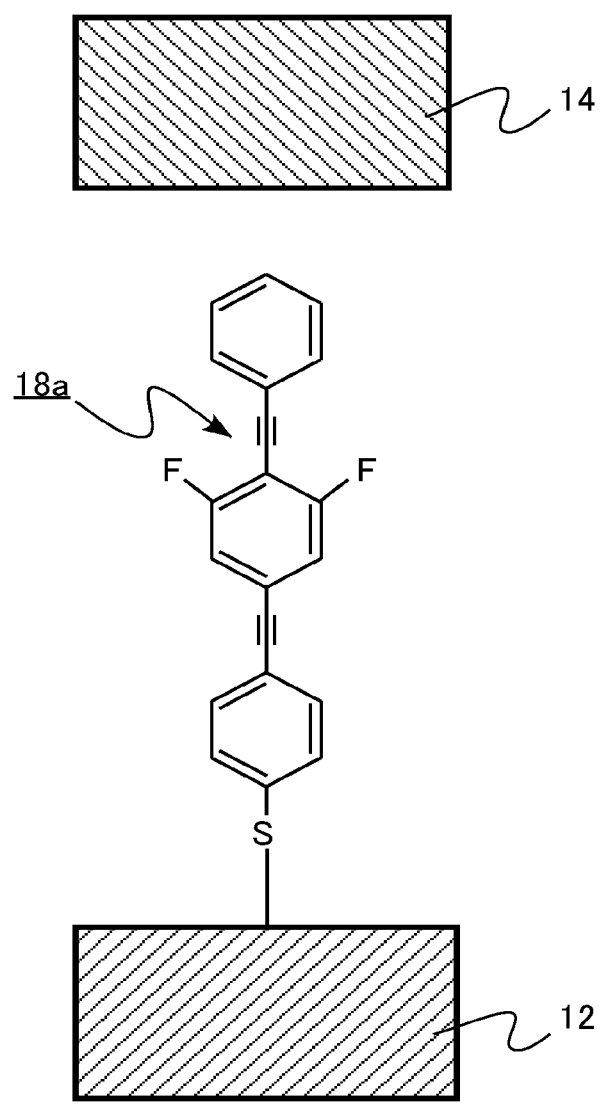
FIG. 9 is a diagram illustrating an example of a molecular structure of an organic molecule in a memory cell portion in a second embodiment.

FIG. 9 is a diagram illustrating an example of a molecular structure of an organic molecule in a memory cell portion in this embodiment. In a resistance-change type molecular chain 18a in FIG. 9, R1 to R9 are hydrogen atoms, n is one, m is zero, and L is a thiol group in Molecular Formula (2):

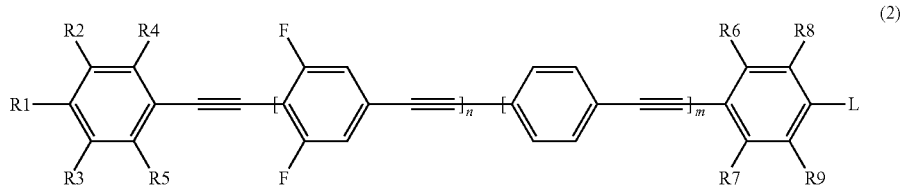

The resistance-change type molecular chain 18*a* in FIG. 9 has an oligophenylene ethynylene backbone including three benzene rings. The resistance-change type molecular chain 18*a* has two fluorine atoms (F) added in meta positions of the middle benzene ring.

The organic molecule in FIG. 9 exhibits negative differential conductance (NDC). Its HOMO level can be made shallower than those of the organic molecules in the first embodiment and the comparative embodiment shown in FIGS. 3A and 3B, which is confirmed by calculation. Thus, an organic molecular memory that operates at a still lower voltage can be realized.

In this embodiment, too long a length of the organic molecule can cause too great a resistance of the organic molecule, making a memory operation difficult. Therefore, as shown in Molecular Formula (2), it is desirable to set the maximum value of n at 2 and the maximum value of m at 3.

In terms of ease of synthesis of the organic molecule and facilitating the development of NDC characteristics, the benzene ring with the two fluorine atoms in meta positions is desirably located in a position adjacent to the benzene ring at the end opposite to the linker as shown in Molecular Formula (2).

In this embodiment, R1 to R9 in Molecular Formula (2) are desirably hydrogen atoms in terms of facilitating the synthesis of the organic molecule.

It is desirable that n is 1 and m is 0 in Molecular Formula (2) in terms of facilitating the synthesis of the organic molecule, and in terms of scaling-down the memory cell.

At least one of R2 to R9 in Molecular Formula (2) is desirably a fluorine atom. By one of the benzene rings at the both ends having an electron withdrawing group such as a fluorine atom, a movable and great electric dipole efficiency is provided. Thus, the relative permittivity of the organic molecular layer 16 is increased. As a result, the charge retention characteristics of the organic molecular memory are improved. Further, a voltage applied from one end of the molecule is increased. As a result, rectification is developed. In this case, when fluorine atoms are added to R2 to R5, R6 to R9 preferably have no fluorine atoms. When fluorine atoms are added to R6 to R9, R2 to R5 preferably have no fluorine atoms.

L in Molecular Formula (2) is desirably a chemically modifying group selected from the group consisting of a thiol group, a silanol group such as monomethoxysilane, trimethoxysilane, monoethoxysilane, or triethoxysilane, and a phosphonate group.

R1 in Molecular Formula (2) is desirably an amino group (—NH$_2$), a hydroxy group (—OH), or a nitro group (—NO$_2$) in terms of developing rectification in the organic molecule. Having rectification, resistance-change type molecular chains can also have a diode function required for each memory cell to realize a cross-point type memory cell. Thus, further scaling-down of a memory cell can be achieved.

As a result of calculation by density functional method B3LYP1, in the case of an organic molecule having the following molecular structure illustrated in FIG. 9, displacement of C—F bonds due to the inter-ring mode can be observed in the vicinity of 1155 cm$^{-1}$, 1272 cm$^{-1}$, and 1487 cm$^{-1}$, and displacement of C—F bonds due to the intra-ring mode is in the vicinity of 1369 cm$^{-1}$. Thus, the organic molecule develops NDC.

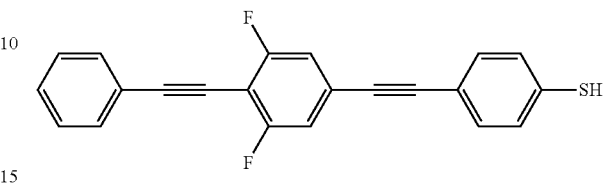

Further, as a result of calculation, while the HOMO level is −5.79 eV in the comparative embodiment in FIG. 3B and −5.63 eV in the first embodiment in FIG. 3A, it is −5.42 eV in the case of an organic molecule with the above molecular structure (the same as the resistance-change type molecular chain 18*a* in FIG. 9), which is shallower. Thus, the operating voltage can be reduced more than the comparative embodiment and the first embodiment.

The above-described organic molecule has a dipole in a long chain direction, and thus also has rectification. Therefore, resistance-change type molecular chains can also have a diode function required for each memory cell to realize a cross-point type memory cell. Thus, further scaling-down of a memory cell can be achieved.

As above, this embodiment can realize an organic molecular memory that operates at a voltage still lower than that in the first embodiment. Further, by organic molecules having rectification, memory cells can be scaled down, realizing an organic molecular memory having a high degree of integration.

Third Embodiment

An organic molecular memory in this embodiment is different from that in the first embodiment in that an organic molecule is chemically bonded to both a first conductive layer and a second conductive layer. Hereinafter, contents overlapping with those in the first embodiment will not be described.

An organic molecule in this embodiment is described by Molecular Formula (1):

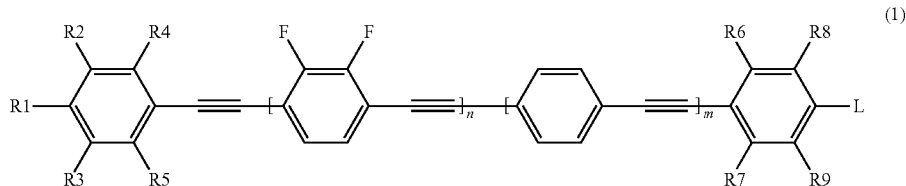

R1 in Molecular Formula (1) is a chemically modifying group selected from an imino group (—NH—), an ether group (—O—), and an ester group (—COO—), R2 to R9 are hydrogen atoms or fluorine atoms, L is a chemically modifying group chemically bonding the organic molecule to a first conductive layer 12 or a second conductive layer 14, n is one or two, and m is zero, one, or two.

Figure 10:
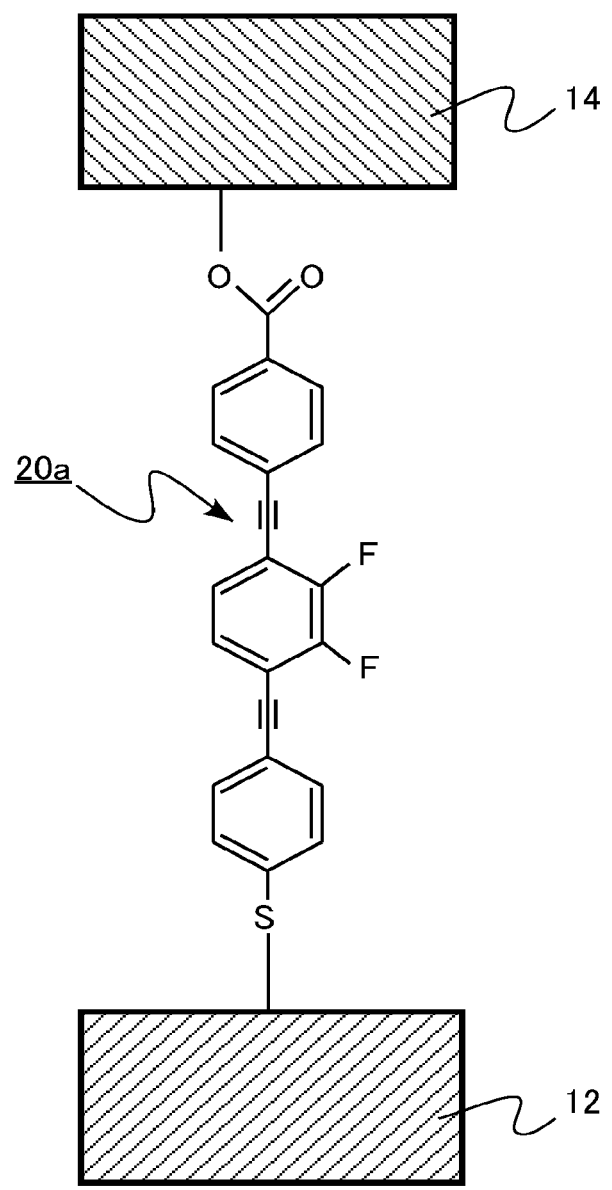
FIG. 10 is a diagram illustrating an example of a molecular structure of an organic molecule in a memory cell portion in a third embodiment.

FIG. 10 is a diagram illustrating an example of a molecular structure of an organic molecule in a memory cell portion in this embodiment. In a resistance-change type molecular chain 20a in FIG. 10, R1 is an ester group, R2 to R9 are hydrogen atoms, n is one, m is zero, and L is a thiol group in Molecular Formula (1):

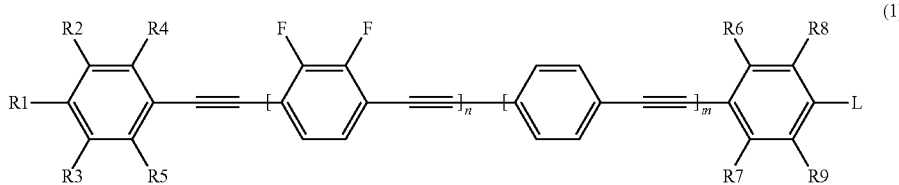

The resistance-change type molecular chain 20a in FIG. 10 has an oligophenylene ethynylene backbone including three benzene rings. The resistance-change type molecular chain 20a has two fluorine atoms (F) added in ortho positions of the middle benzene ring.

The resistance-change type molecular chain 20a is chemically bonded to a surface of a lower electrode wire (first conductive layer) 12 by a thiol group as a linker. Further, an ester group is added to a benzene ring of the oligophenylene ethynylene backbone at the end opposite to the linker. By the ester group, the resistance-change type molecular chain 20a is chemically bonded to an upper electrode wire (second conductive layer) 14.

The organic molecule in this embodiment exhibits negative differential conductance (NDC). Its HOMO level is shallow, and thus allows realization of an organic molecular memory that operates at a low voltage.

In the organic molecule in this embodiment, R1 is a chemically modifying group selected from an imino group, an ether group, and an ester group, and is chemically bonded to the upper electrode wire (second conductive layer) 14. Therefore, memory characteristics are stabilized.

Further, when a film for the upper electrode wire 14 is formed on the organic molecular layer 16 by an atomic layer deposition (ALD) method or an electroless plating method, for example, reaction with the chemically modifying group in the R1 position facilitates film formation. Therefore, an easy-to-manufacture organic molecular memory can be realized.

Specifically, it is preferably a derivative such as an amino group, a hydroxy group, or a carboxyl group.

In this embodiment, too long a length of the organic molecule can cause too great a resistance of the organic molecule, making a memory operation difficult. Therefore, as shown in Molecular Formula (1), it is desirable to set the maximum value of n at 2 and the maximum value of m at 3.

In terms of ease of synthesis of the organic molecule and facilitating the development of NDC characteristics, the benzene ring having the two fluorine atoms in ortho positions is desirably located in a position adjacent to the benzene ring at the end opposite to the linker as shown in Molecular Formula (1).

In this embodiment, R2 to R9 in Molecular Formula (1) are desirably hydrogen atoms in terms of facilitating the synthesis of the organic molecule.

It is desirable that n is 1 and m is 0 in Molecular Formula (1) in terms of facilitating the synthesis of the organic molecule, and in terms of scaling-down the memory cell.

At least one of R2 to R9 in Molecular Formula (1) is desirably a fluorine atom. By the benzene rings at the both ends having an electron withdrawing group such as a fluorine atom, a movable and great electric dipole efficiency is provided. Thus, the relative permittivity of the organic molecular layer 16 is increased. As a result, the charge retention characteristics of the organic molecular memory are improved.

L in Molecular Formula (1) is desirably a chemically modifying group selected from the group consisting of a thiol group, a silanol group such as monomethoxysilane, trimethoxysilane, monoethoxysilane, or triethoxysilane, and a phosphonate group.

As above, this embodiment can realize an organic molecular memory that operates at a low voltage as the first embodiment. Further, an easy-to-manufacture organic molecular memory having stable memory characteristics is realized.

Fourth Embodiment

An organic molecular memory in this embodiment is the same as the third embodiment except that a second conductive layer has a metal oxide film on the organic molecular layer side. Hereinafter, contents overlapping with those in the first to third embodiments will not be described.

An organic molecule in this embodiment is described by Molecular Formula (1):

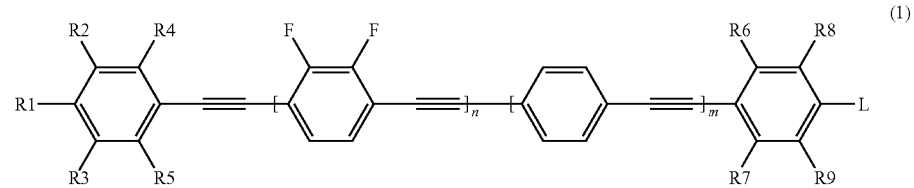

R1 in Molecular Formula (1) is a chemically modifying group selected from an imino group (—NH—), an ether group (—O—), and an ester group (—COO—), R2 to R9 are hydrogen atoms or fluorine atoms, L is a chemically modifying group chemically bonding the organic molecule to a first conductive layer 12 or a second conductive layer 14, n is one or two, and m is zero, one, or two.

Figure 11:
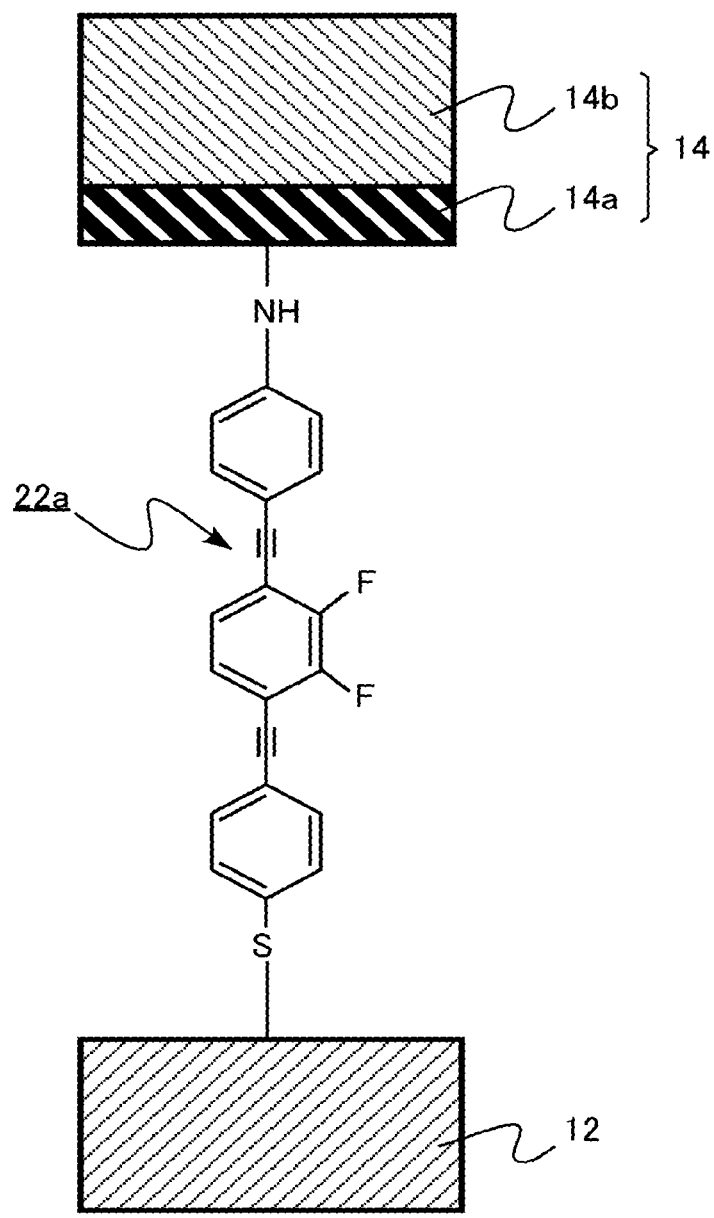
FIG. 11 is a diagram illustrating an example of a molecular structure of an organic molecule in a memory cell portion in a fourth embodiment.

FIG. 11 is a diagram illustrating an example of a molecular structure of an organic molecule in a memory cell portion in this embodiment. In a resistance-change type molecular chain 22a in FIG. 11, R1 is an imino group, R2 to R9 are hydrogen atoms, n is one, m is zero, and L is a thiol group in Molecular Formula (1):

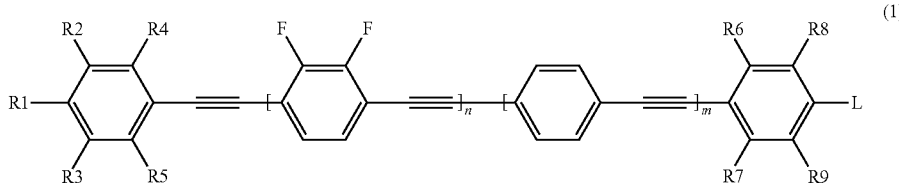

The resistance-change type molecular chain 22a in FIG. 11 has an oligophenylene ethynylene backbone including three benzene rings. The resistance-change type molecular chain 22a has two fluorine atoms (F) added in ortho positions of the middle benzene ring.

An upper electrode wire (second conductive layer) 14 has a metal oxide film 14a on the organic molecular layer 16 side. The upper electrode wire (second conductive layer) 14 has a stacked structure with the metal oxide film 14a and a metal film 14b, for example. The metal oxide film 14a is a silicon oxide film, an aluminum oxide film, or a hafnium oxide film, for example. The metal film 14b is tungsten (W), molybdenum (Mo), or the like, for example.

The resistance-change type molecular chain 22a is chemically bonded to a surface of the lower electrode wire (first conductive layer) 12 by a thiol group as a linker. Further, an imino group is added to the benzene ring of the oligophenylene ethynylene backbone at the end opposite to the linker. The imino group chemically bonds the resistance-change type molecular chain 22a to the metal oxide film 14a.

The organic molecule in this embodiment exhibits negative differential conductance (NDC). Its HOMO level is shallow, and thus allows realization of an organic molecular memory that operates at a low voltage.

The organic molecule in this embodiment is chemically bonded to the metal oxide film 14a by R1 that is a chemically modifying group selected from an imino group (—NH—), an ether group (—O—), and an ester group (—COO—). Thus, memory characteristics are stabilized.

The provision of the metal oxide film 14a can prevent charges from passing through the organic molecular layer 16 to the upper electrode wire 14. Therefore, the data retention characteristics of the organic molecular memory are improved. The thickness of the metal oxide film 14a is desirably 5 nm or less in terms of preventing resistance between the lower electrode wire 12 and the upper electrode wire 14 from becoming too high.

When a film for the upper electrode wire 14 is formed on the organic molecular layer 16 by an ALD method or an electroless plating method, for example, by first forming the metal oxide film 14a, reactivity with a chemically modifying group in the R1 position is increased, facilitating film formation. Therefore, an easy-to-manufacture organic molecular memory is realized.

In this embodiment, too long a length of the organic molecule can cause too great a resistance of the organic molecule, making a memory operation difficult. Therefore, as shown in Molecular Formula (1), it is desirable to set the maximum value of n at 2 and the maximum value of m at 3.

In terms of ease of synthesis of the organic molecule and facilitating the development of NDC characteristics, the benzene ring with the two fluorine atoms in ortho positions is desirably located in a position adjacent to the benzene ring at the end opposite to the linker as shown in Molecular Formula (1).

In this embodiment, R2 to R9 in Molecular Formula (1) are desirably hydrogen atoms in terms of facilitating the synthesis of the organic molecule.

It is desirable that n is 1 and m is 0 in Molecular Formula (1) in terms of facilitating the synthesis of the organic molecule, and in terms of scaling-down the memory cell.

At least one of R2 to R9 in Molecular Formula (1) is desirably a fluorine atom. By one of the benzene rings at the both ends having an electron withdrawing group such as a fluorine atom, a movable and great electric dipole efficiency is provided. Thus, the relative permittivity of the organic molecular layer 16 is increased. As a result, the charge retention characteristics of the organic molecular memory are improved. Further, this increases a voltage applied from one end of the molecule. As a result, rectification is developed. In this case, when fluorine atoms are added to R2 to R5, R6 to R9 preferably have no fluorine atoms. When fluorine atoms are added to R6 to R9, R2 to R5 preferably have no fluorine atoms.

L in Molecular Formula (1) is desirably a chemically modifying group selected from the group consisting of a thiol group, a silanol group, and a phosphonate group.

As above, this embodiment can realize an organic molecular memory that operates at a low voltage as the first embodiment. Further, an easy-to-manufacture organic molecular memory having stable memory characteristics is realized. Furthermore, an organic molecular memory excellent in data retention characteristics is realized.

EXAMPLES

Hereinafter, examples will be described. First, examples of synthesis of the organic molecules in the embodiments including organic molecules used in examples will be described.

Synthesis Example 1

Under a nitrogen gas stream, dehydrated tetrahydrofuran (THF) was added to 1,2-difluorobenzene (compound 1), and it was cooled to −65° C. n-BuLi was dropped into it, and it was stirred at −65° C. for an hour and a half. A dehydrated THF solution of iodine was dropped into it, and it was stirred at −65° C. for an hour and a half. A saturated sodium ammonium solution was added to it, and it was extracted with ethyl acetate. It was cleaned with a 10% sodium thiosulfate solution and a saturated sodium chloride solution, sequentially, and was dried with anhydrous sodium sulfate. The solvent was distilled away under a reduced pressure, and compound 2 was obtained as a light yellow oily substance.

[Compound 1]

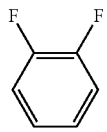

[Compound 2]

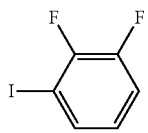

[Compound 3]

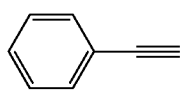

Under a nitrogen gas stream, phenylacetylene (compound 3), dehydrated dioxane, N-ethyldiisopropylamine, copper (I) iodide, triphenylphosphine were added to compound 2, and it was deaerated. Then, Bis(triphenylphosphine)palladium(II) dichloride was added to it, and it was stirred at 270° C. for five hours. Bis(triphenylphosphine)palladium(II) dichloride was added to it, and it was stirred at 250° C. for fifteen hours. It was filtered with Celite, and a solvent was distilled away under a reduced pressure. The residue was purified by silica gel column chromatography (a mobile phase: hexane/chloroform=95/5→9/1), and compound 4 was obtained as a light yellow oily substance.

[Compound 4]

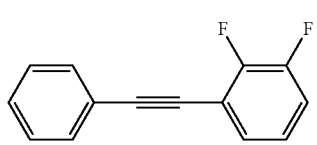

Under a nitrogen gas stream, dehydrated THF (20 mL) was added to compound 4, and it was cooled to −63° C. n-BuLi was dropped into it, and it was stirred at −65° C. for an hour and a half. A dehydrated THF solution of iodine is dropped into it, and it was stirred at −63° C. for an hour and a half. A saturated sodium ammonium solution was added to it, and it was extracted with ethyl acetate. It was cleaned with a 10% sodium thiosulfate solution and a saturated sodium chloride solution, sequentially, and was dried with anhydrous sodium sulfate. A solvent was distilled away under a reduced pressure, and MTBE and hexane was added to a residue to clean it, and compound 5 was obtained as a white solid.

[Compound 5]

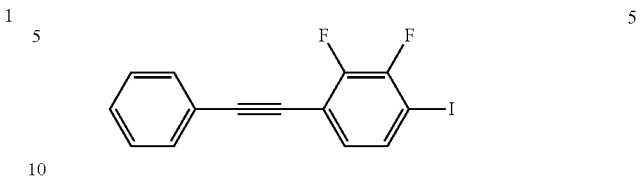

Under a nitrogen gas stream, dehydrated dioxane, compound 6, N-ethyldiisopropylamine, copper (I) iodide, triphenylphosphine were added to compound 5, and it was deaerated. Then, Bis(triphenylphosphine)palladium(II) dichloride was added to it, and it was stirred at 20° C. for eighteen hours. It was filtered with Celite, and a solvent was distilled away under a reduced pressure. A residue was purified by column chromatography (a mobile phase: hexane/chloroform=10/1→2/1→3/2). It was cleaned with IPA, and compound 7 was obtained as a white solid.

[Compound 6]

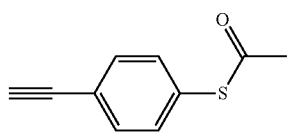

[Compound 7]

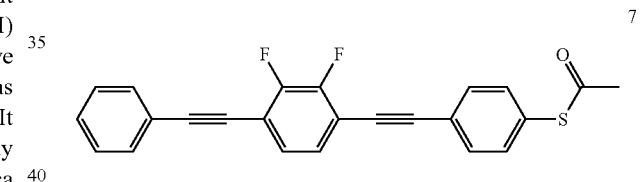

Under a nitrogen gas stream, dehydrated methanol was added to compound 7. Under ice cooling, potassium carbonate was added to it, and it was stirred at room temperature for twenty-four hours. A reaction liquid was filtered, and a 2% acetic acid solution was added to it. It was filtered and dried under a reduced pressure, and compound 8 (4-[2,3-difluoro-4-(phenylethynyl)phenylethynyl]benzenethiol: compound 8) was obtained as a white solid.

[Compound 8]

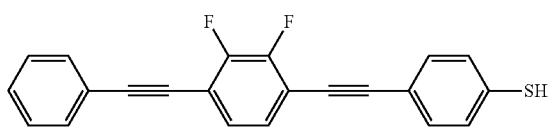

Synthesis Example 2

In place of compound 3 in Synthesis Example 1, compound 9 below was used to perform synthesis in a similar manner. As a result, compound 10 was obtained.

[Compound 9]

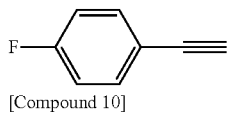

[Compound 10]

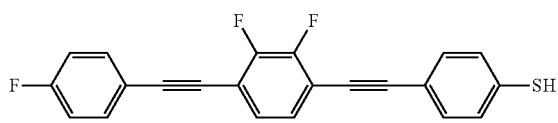

Synthesis Example 3

In place of compound 3 in Synthesis Example 1, compound 11 below was used to perform synthesis in a similar manner. As a result, compound 12 was obtained.

[Compound 11]

[Compound 12]

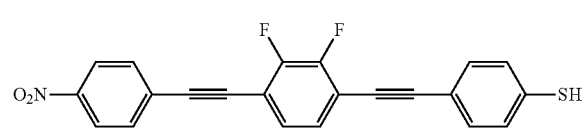

Synthesis Example 4

Acetic acid was added to compound 13, and acetic anhydride was dropped into it. A reaction liquid was increased in temperature to 75° C., and stirred for thirty minutes. After the completion of reaction, it was cooled to 40° C., and water is dropped into it, and it was stirred. A precipitated crystal was filtered and cleaned (water, ethanol), and then dried, and compound 14 was obtained.

[Compound 13]

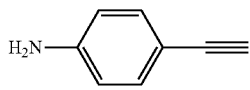

[Compound 14]

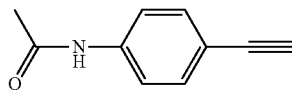

In place of compound 3 in Synthesis Example 1, compound 14 above was used to perform synthesis in a similar manner. As a result, compound 15 was obtained.

[Compound 15]

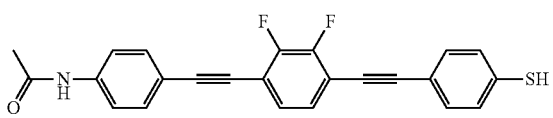

Dehydrated chloroform and dehydrated ethanol were added to compound 15, and it was heated to 40° C. Dried potassium carbonate was added to it, and it was stirred for three hours. A reaction liquid was returned to room temperature, and the reaction liquid was dropped into a 1% acetic acid aqueous solution, and was extracted with chloroform. An organic phase was dehydrated and dried with anhydrous sodium sulfate, and filtered, and then was separated through a silica gel column with 0.1 acetic acid/chloroform as a solvent, and compound 16 was obtained.

[Compound 16]

Next, examples will be described.

Example 1

A sample for measurement was prepared by the following method.

A gold (Au) substrate was formed on a cleaved mica surface by a vacuum thermal evaporation method. Before use, the Au substrate was flame-annealed, and then rapidly cooled in ethanol to form an Au (111) surface on the mica surface. The Au substrate was cleaned by $UV/O_3$ (02: 0.01 [MPa], 1 [min], UV irradiation: 12 [min]).

The Au substrate was immersed in an ethanol solution of 1 mM octanethiol (C8S) for twenty-three hours. Then, it was rinsed with ethanol, and dried by nitrogen blowing. It was immersed in a 0.01 mM toluene solution of compound 8 for three hours, thereby to deposit compound 8 shown in the above Synthesis Example 1 on the Au (111) surface.

After the organic molecules are formed on the Au surface, the substrate was introduced into UHV-STM (JEOL: JSTM-4500). A tungsten (W) probe (tip) of a scanning tunneling microscope (STM) was electrochemically etched in a potassium hydroxide (KOH) solution. Before use, the probe was cleaned by electron beam bombardment in a UHVSTM chamber.

An STM image was obtained with a bias voltage to the sample in a constant current mode. During measurements with the scanning tunneling microscope (STM), the STM probe was held at a fixed position on the sample without performing feedback control. Measurements in the example were all performed at room temperature, and vacuum pressure was maintained at $10^8$ Pa.

Figure 12:
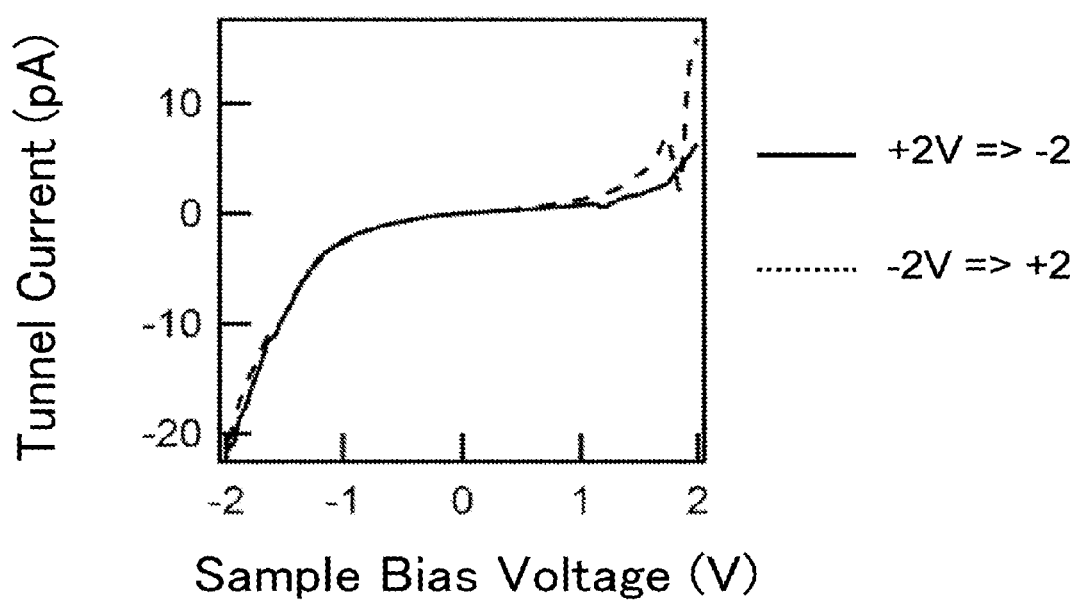
FIG. 12 is a graph showing measurement results in Example 1.

FIG. 12 is a graph showing measurement results in Example 1. It shows current-voltage (I-V) curves of compound 8. Compound 8 has the same molecular structure as the resistance-change type molecular chain 16a in the first embodiment.

A solid line is the result of scanning the voltage from +2.0 V to −2.0 V. A dotted line is the result of scanning the voltage from −2.0 V to +2.0 V. By scanning from −2.0 V to +2.0 V, current rose from about +1 V, increasing greatly, and then rapidly decreased at about 1.8 V. Between −1.0 V and +1.0 V, current did not flow across the tungsten probe and the Au substrate, and the sample was absolutely an insulator.

The above-described phenomenon is very different from a phenomenon seen in a standard inorganic semiconductor. The above-described phenomenon is due to the levels of electrons in organic molecules.

The highest occupied molecular orbital (HOMO) level of compound 8 is −5.878 eV. The HOMO level is determined by structure optimization and vibration analytical calculation using base function 6-31G(d), using density functional method B3LYP1. The Fermi level of Au is −5.2 eV.

At near 0 V, current does not flow because the HOMO level does not agree with the Fermi level. When a more positive voltage is applied across the tungsten probe and the Au substrate, the HOMO level agrees with the Fermi level, and current starts to flow, making the sample a conductor.

The voltage at which current starts to flow can be calculated from a difference between the HOMO level and the Fermi level. The calculation result agreed with an actually measured value.

When the voltage is scanned from +2.0 V to −2.0 V, the I-V curve draws a locus different from that when the voltage is scanned from −2.0 V to +2.0 V. Between +1.0 V and +2.0 V, current becomes smaller than that when the voltage is scanned from −2.0 V to +2.0 V.

The difference in the I-V curves due to scanning directions is hysteresis in the I-V curves, and proves that the organic molecule in this example has a memory effect. In a region where the applied voltage is a negative bias, the I-V curves coincide with each other regardless of the voltage scanning directions, and hysteresis was not observed. Therefore, it can be said that in the organic molecule in this example, NDC occurs only when the applied voltage is a positive bias.

By Example 1, NDC was observed at a low voltage of about 1.8 V. Thus, it was confirmed that a resistance-change type organic molecular memory that operates at a low voltage can be realized.

Example 2

A sample was prepared in a manner similar to that in Example 1 except that compound 16 was used as an organic molecule in place of compound 8.

Figure 13:
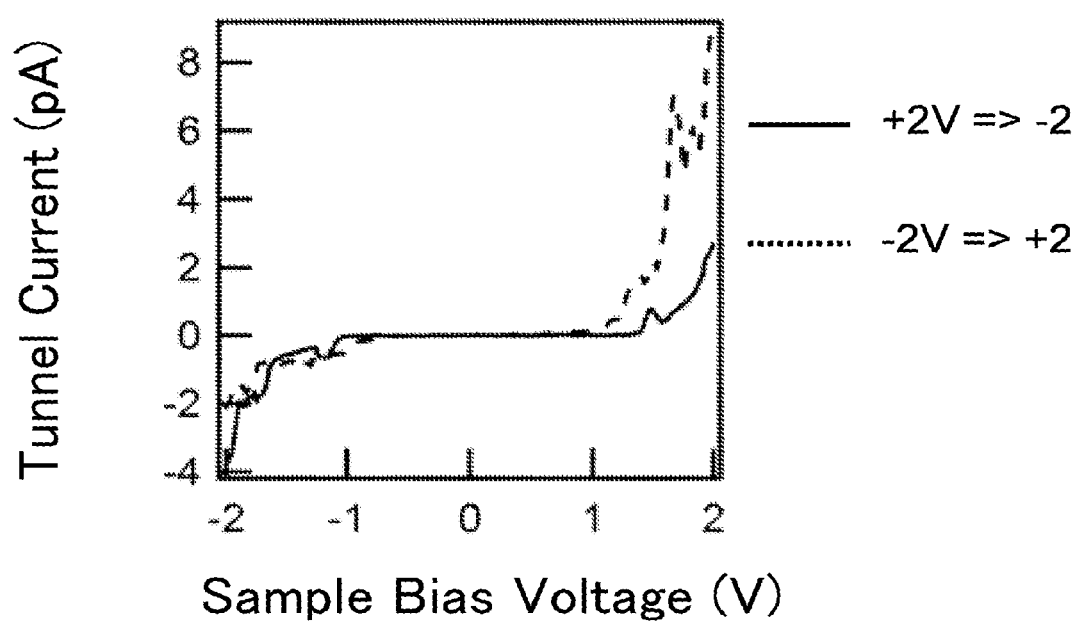
FIG. 13 is a graph showing measurement results in Example 2.

FIG. 13 is a graph showing measurement results in Example 2. It shows current-voltage (I-V) curves of compound 16. Compound 16 has the same molecular structure as the resistance-change type molecular chain 22a in the fourth embodiment.

As in Example 1, between −1.0 V and +1.0 V, current did not flow across the tungsten probe and the Au substrate, and the sample was absolutely an insulator. At +1.0 V to +1.2 V, current starts to flow because the HOMO level of compound 16 agrees with the Fermi level. NDC is observed at about 1.7 V.

When the voltage is scanned from +2.0 V to −2.0 V, the I-V curve draws a locus different from that when the voltage is scanned from −2.0 V to +2.0 V. Between +1.0 V and +2.0 V, current becomes smaller than that when the voltage is scanned from −2.0 V to +2.0 V.

The difference in the I-V curves due to scanning directions is hysteresis in the I-V curves, and proves that the organic molecule in this example has a memory effect. In a region where the applied voltage is a negative bias, the I-V curves coincide with each other regardless of the voltage scanning directions, and hysteresis was not observed. Therefore, it can be said that in the organic molecule in this example, NDC occurs only when the applied voltage is a positive bias.

By Example 2, NDC was observed at a low voltage of about 1.7 V. Thus, it was confirmed that a resistance-change type organic molecular memory that operates at a low voltage can be realized.

Example 3

Figure 14:
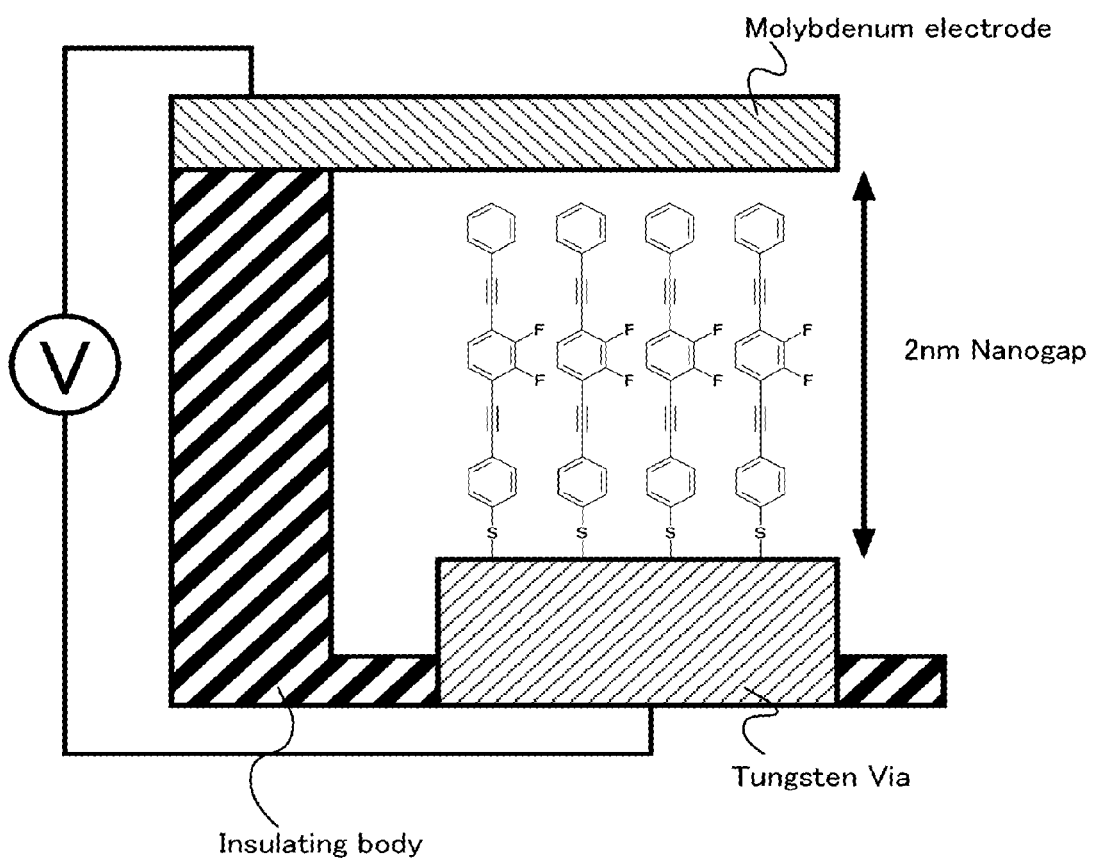
FIG. 14 is a diagram illustrating a device structure in Example 3.

A memory cell of an organic molecular memory was produced, using a semiconductor manufacturing process. A two-terminal device with a lower tungsten (W) via and an upper molybdenum (Mo) electrode were produced using a semiconductor manufacturing process. FIG. 14 is a diagram illustrating a device configuration in this example.

A gap between the tungsten via and the molybdenum electrode was 2 nm. The gap between the two metals has a very high breakdown voltage. A leak current was not observed until the voltage across the metals becomes 7 to 8 V and the gap structure did not change observed by TEM.

A substrate formed with the gap between the tungsten via and the molybdenum electrode was immersed in a toluene solution of 0.01 mM compound 8 for three hours to form an organic molecular layer of compound 8 in the gap. After it was dried in a nitrogen atmosphere, its current-voltage (I-V) characteristics were measured.

Figure 15:
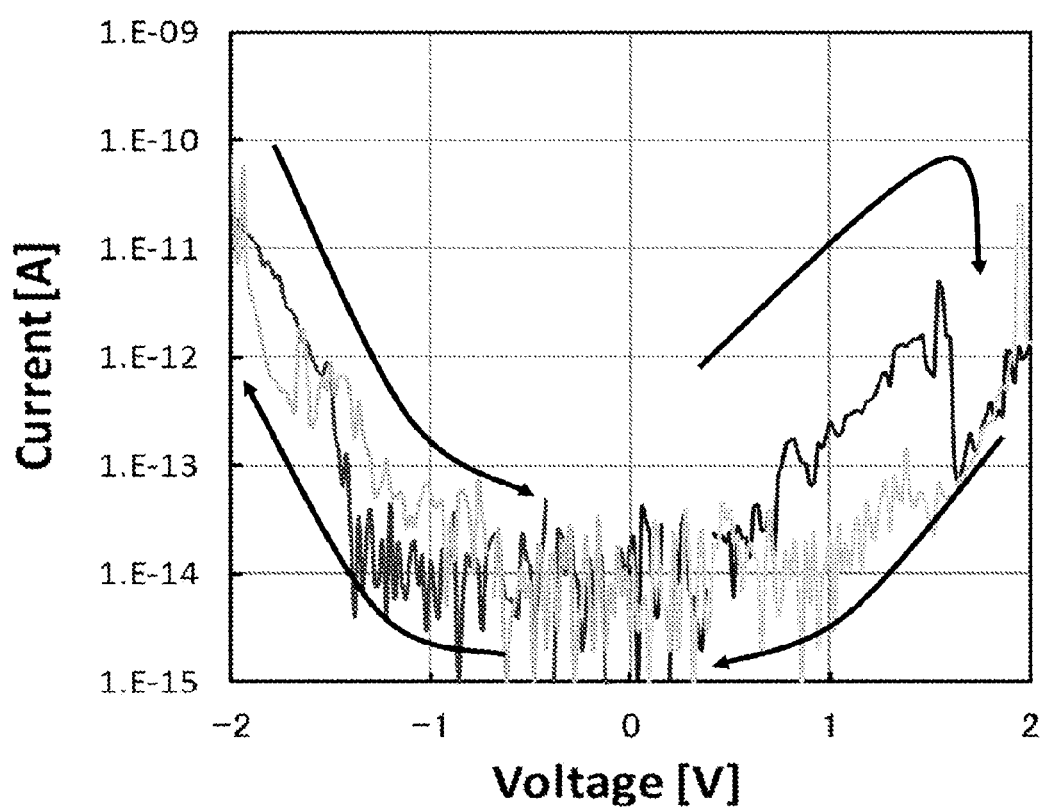
FIG. 15 is a graph showing measurement results in Example 3.

FIG. 15 is a graph showing measurement results in Example 3. It shows current-voltage (I-V) curves of compound 8 interposed in the nanogap between the two metals.

In the positive bias (right in the figure) region from 0 V, current starts to increase from about 0.8 V, and rapidly decreases at about 1.8 V. When the voltage was decreased from +2.0 V, a rapid change in current was not observed. In the negative bias region, current increased as a more negative voltage was applied, and current decreased when a less negative voltage was applied. A rapid increase or phenomenon in current was not observed.

A rapid decrease in current observed at about 1.8 V can be explained as a similar phenomenon as that observed in the STS measurement in Example 1.

By Example 3, NDC was observed at a low voltage of about 1.8 V in the memory cell produced using the semiconductor manufacturing process. Thus, it was confirmed that a resistance-change type organic molecular memory that operates at a low voltage can be realized.

Although the cross-point type organic molecular memory has been described as an example of the organic molecular memory in the embodiments, the present disclosure can be applied to organic molecular memories of other structures.

Although the organic molecule described by Molecular Formula (1) has been described as an example in the third and fourth embodiments, it is also possible to apply the organic molecule described by Molecular Formula (2).

While certain embodiments have been described, these embodiments have been presented by way of example only, and are not intended to limit the scope of the inventions. Indeed, the organic molecular memory described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. An organic molecular memory comprising:
    a first conductive layer;
    a second conductive layer; and
    an organic molecular layer provided between the first conductive layer and the second conductive layer, the organic molecular layer including an organic molecule having an oligophenylene ethynylene backbone, the oligophenylene ethynylene backbone including three or more benzene rings, and the oligophenylene ethynylene backbone including two fluorine atoms added in ortho positions or meta positions of one of the benzene rings other than benzene rings at both ends.

2. The organic molecular memory according to claim 1, wherein the organic molecule is chemically bonded to the first conductive layer or the second conductive layer.

3. The organic molecular memory according to claim 1, wherein the organic molecule is described by Molecular Formula (1):

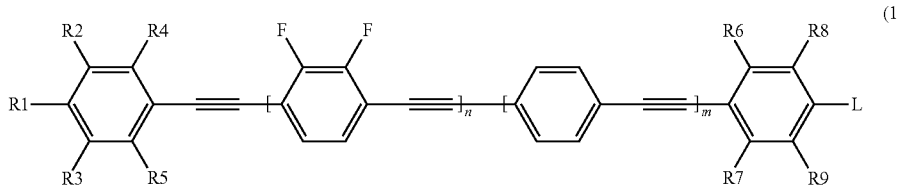

wherein R1 is a chemically modifying group selected from a group consisting of an amino group (—NH), an imino group (—NH—), a hydroxy group (—OH), an ether group (—O—), an ester group (—COO—), a carboxy group (—COOH), and a nitro group (—NO$_2$), or a hydrogen atom, or a fluorine atom, R2 to R9 are hydrogen atoms or fluorine atoms, L is a chemically modifying group chemically bonding the organic molecule to the first conductive layer or the second conductive layer, n is one or two, and m is zero, one, or two.

4. The organic molecular memory according to claim 3, wherein
the organic molecule is chemically bonded to the first conductive layer by the L, and
the R1 is a chemically modifying group selected from a group consisting of an imino group (—NH—), an ether group (—O—), and an ester group (—COO—), and the organic molecule is chemically bonded to the second conductive layer by the R1.

5. The organic molecular memory according to claim 4, wherein
the second conductive layer has a metal oxide film on the organic molecular layer side, and
the organic molecule is chemically bonded to the metal oxide film by the R1.

6. The organic molecular memory according to claim 4, wherein the R2 to R9 are hydrogen atoms, the n is one, and the m is zero.

7. The organic molecular memory according to claim 5, wherein the R2 to R9 are hydrogen atoms, the n is one, and the m is zero.

8. The organic molecular memory according to claim 3, wherein at least one of the R2 to R9 is a fluorine atom.

9. The organic molecular memory according to claim 3, wherein the R2 to R9 are hydrogen atoms, the n is one, and the m is zero.

10. The organic molecular memory according to claim 3, wherein the L is a chemically modifying group selected from a group consisting of a thiol group, a silanol group such as monomethoxysilane, trimethoxysilane, monoethoxysilane, or triethoxysilane, and a phosphonate group.

11. The organic molecular memory according to claim 1, wherein the organic molecule is described by Molecular Formula (2):

wherein R1 is a chemically modifying group selected from a group consisting of an amino group (—NH$_2$), an imino group (—NH—), a hydroxy group (—OH), an ether group (—O—), an ester group (—COO—), a carboxy group (—COOH), and a nitro group (—NO$_2$), or a hydrogen atom, or a fluorine atom, R2 to R9 are hydrogen atoms or fluorine atoms, and L is a chemically modifying group chemically bonding the organic molecule to the first conductive layer or the second conductive layer.

12. The organic molecular memory according to claim 11, wherein
the organic molecule is chemically bonded to the first conductive layer by the L, and
the R1 is a chemically modifying group selected from a group consisting of an imino group (—NH—), an ether group (—O—), and an ester group (—COO—), and the organic molecule is chemically bonded to the second conductive layer by the R1.

13. The organic molecular memory according to claim 12, wherein
the second conductive layer has a metal oxide film on the organic molecular layer side, and
the organic molecule is chemically bonded to the metal oxide film by the R1.

14. The organic molecular memory according to claim 12, wherein the R2 to R9 are hydrogen atoms, the n is one, and the m is zero.

15. The organic molecular memory according to claim 13, wherein the R2 to R9 are hydrogen atoms, the n is one, and the m is zero.

16. The organic molecular memory according to claim 11, wherein at least one of the R2 to R9 is a fluorine atom.

17. The organic molecular memory according to claim 11, wherein the R2 to R9 are hydrogen atoms, the n is one, and the m is zero.

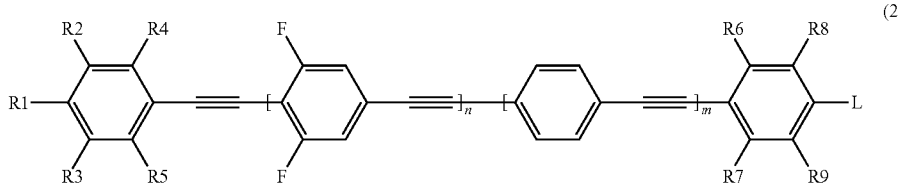

18. The organic molecular memory according to claim 11, wherein the L is a chemically modifying group selected from a group consisting of a thiol group, a silyl ether group, and a phosphonate ester group.

\* \* \* \* \*